United States Patent
Ohba

(10) Patent No.: US 8,890,231 B2
(45) Date of Patent: Nov. 18, 2014

(54) NONVOLATILE SEMICONDUCTOR MEMORY DEVICE WITH A NARROWING CHARGE STORAGE LAYER

(75) Inventor: Ryuji Ohba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/603,710

(22) Filed: Sep. 5, 2012

(65) Prior Publication Data

US 2013/0248967 A1  Sep. 26, 2013

(30) Foreign Application Priority Data

Mar. 23, 2012  (JP) .................................. 2012-068335
Mar. 23, 2012  (JP) .................................. 2012-068401

(51) Int. Cl.
*H01L 29/788* (2006.01)
*H01L 29/66* (2006.01)
*H01L 21/28* (2006.01)
*H01L 27/115* (2006.01)
*H01L 27/02* (2006.01)

(52) U.S. Cl.
CPC ......... *H01L 29/788* (2013.01); *H01L 27/11519* (2013.01); *H01L 27/0207* (2013.01); *H01L 29/66833* (2013.01); *H01L 21/28273* (2013.01); *H01L 27/11521* (2013.01)
USPC .... 257/316; 257/321; 257/202; 257/E29.129; 257/E29.135; 257/E29.3

(58) Field of Classification Search
USPC .......... 257/202, 316, 321, E29.129, E29.135, 257/E29.3
See application file for complete search history.

(56) References Cited

U.S. PATENT DOCUMENTS

| | | | |
|---|---|---|---|
| 5,869,858 A | | 2/1999 | Ozawa et al. |
| 7,692,235 B2 * | | 4/2010 | Yaegashi ........................ 257/319 |
| 2005/0045941 A1 * | | 3/2005 | Kurita et al. ................... 257/315 |
| 2010/0006920 A1 | | 1/2010 | Aoki et al. |
| 2010/0127320 A1 * | | 5/2010 | Nishihara et al. ............. 257/326 |
| 2010/0213534 A1 | | 8/2010 | Sekine et al. |
| 2011/0024824 A1 | | 2/2011 | Shimura et al. |

FOREIGN PATENT DOCUMENTS

| | | |
|---|---|---|
| JP | 8-316348 | 11/1996 |
| JP | 2010-21461 | 1/2010 |
| JP | 2010-219517 | 9/2010 |
| JP | 2010-272703 | 12/2010 |
| JP | 2011-29513 | 2/2011 |

* cited by examiner

*Primary Examiner* — Robert Huber
(74) *Attorney, Agent, or Firm* — Oblon, Spivak, McClelland, Maier & Neustadt, L.L.P.

(57) ABSTRACT

According to one embodiment, a nonvolatile semiconductor memory device includes a first memory cell on the first fin-type active area, and a second memory cell on the second fin-type active area. Each of widths of charge storage layers of the first and second memory cells becomes narrower upward from below. Each of inter-electrode insulating layers of the first and second memory cells has a contact portion through which both are in contact with each other.

23 Claims, 49 Drawing Sheets

Row direction

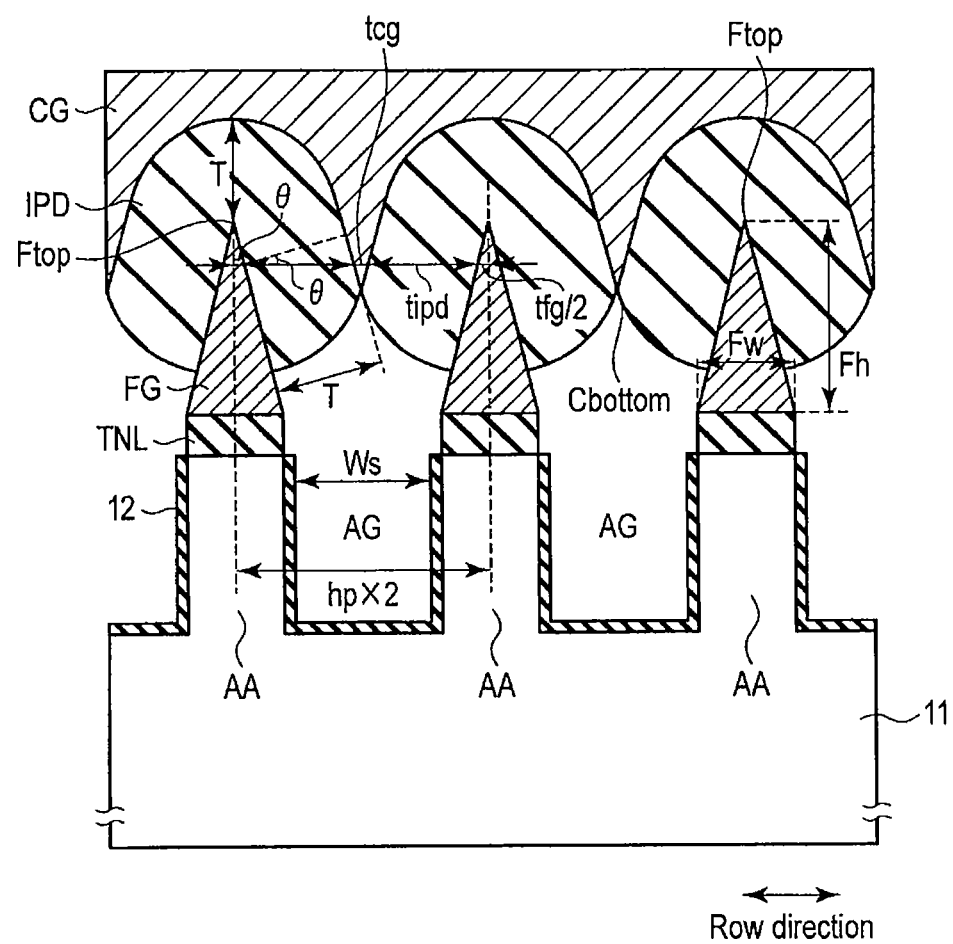
F I G. 2

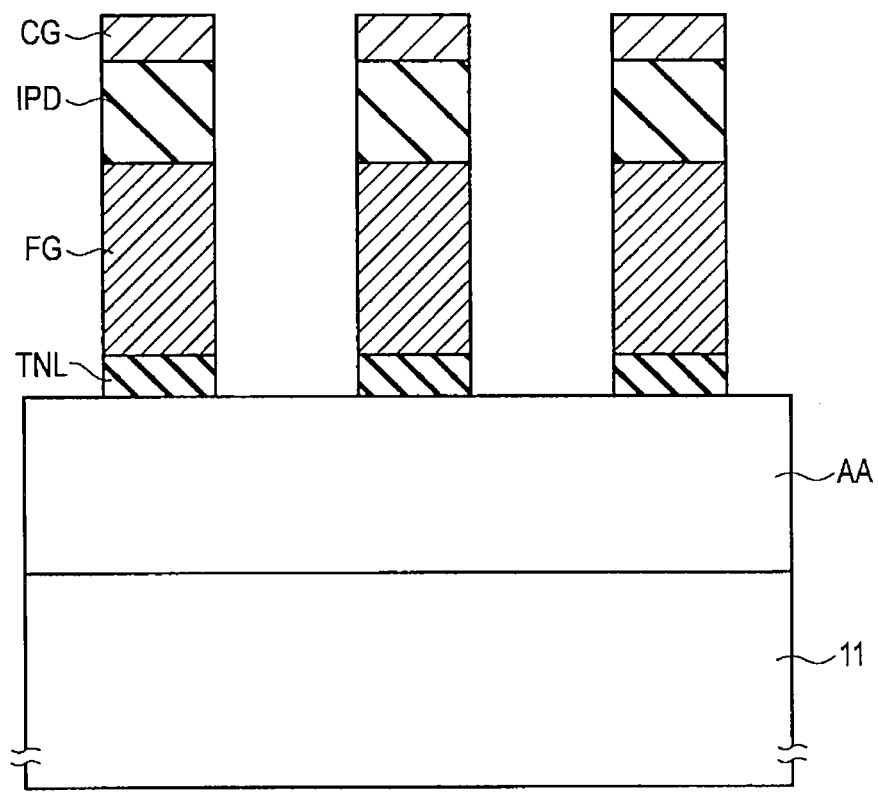
F I G. 3

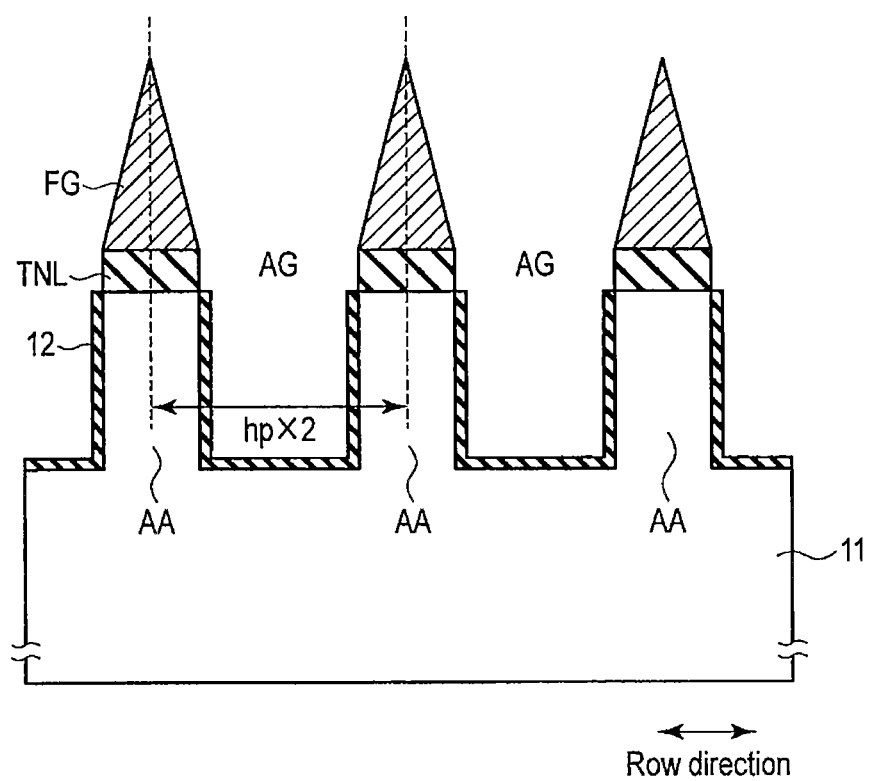
F I G. 4

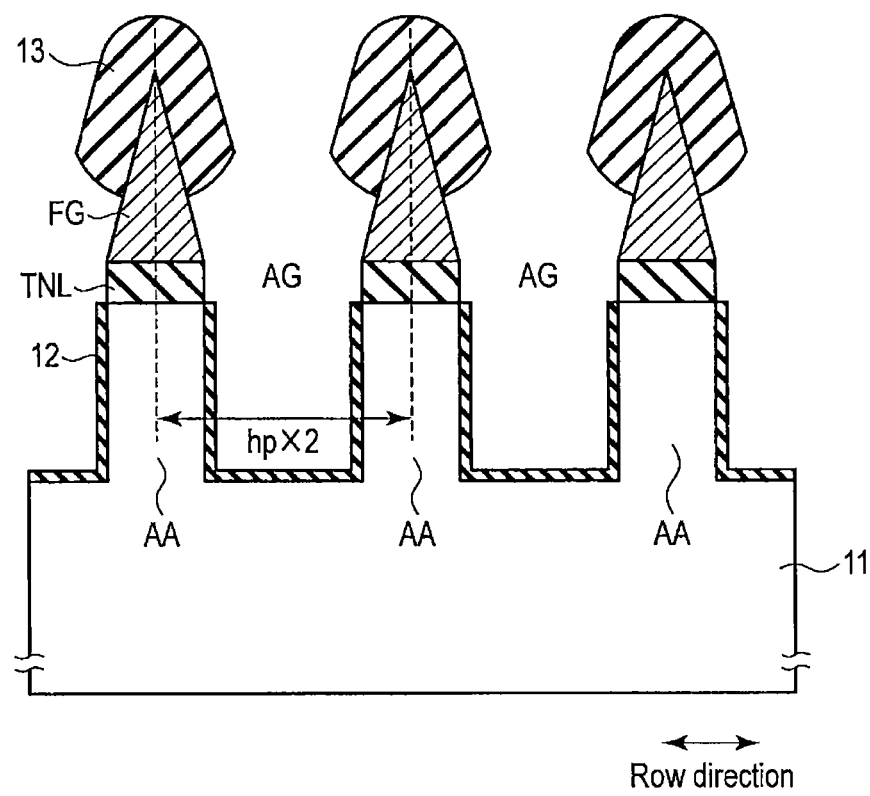
F I G. 5

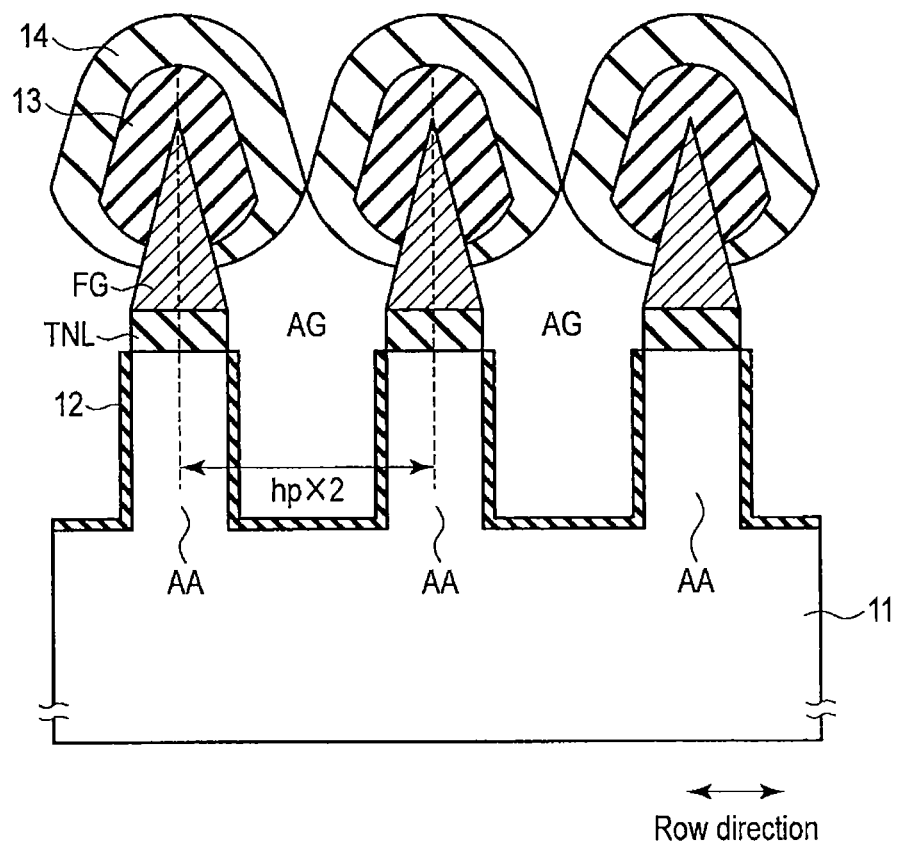
F I G. 6

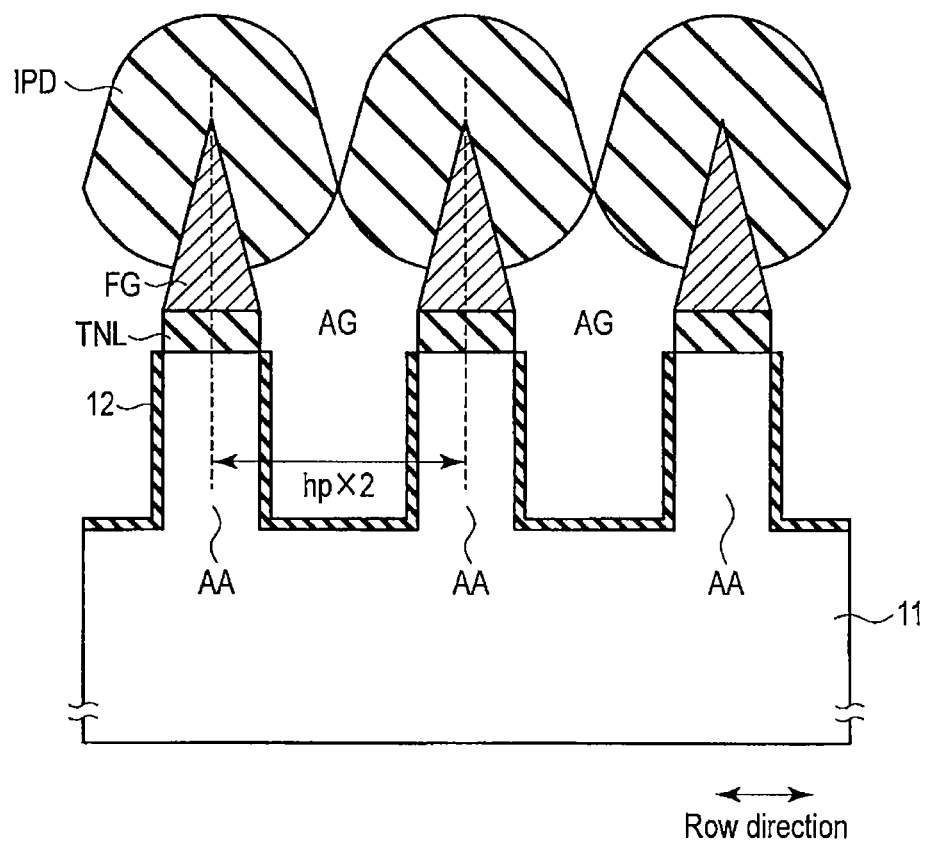
F I G. 7

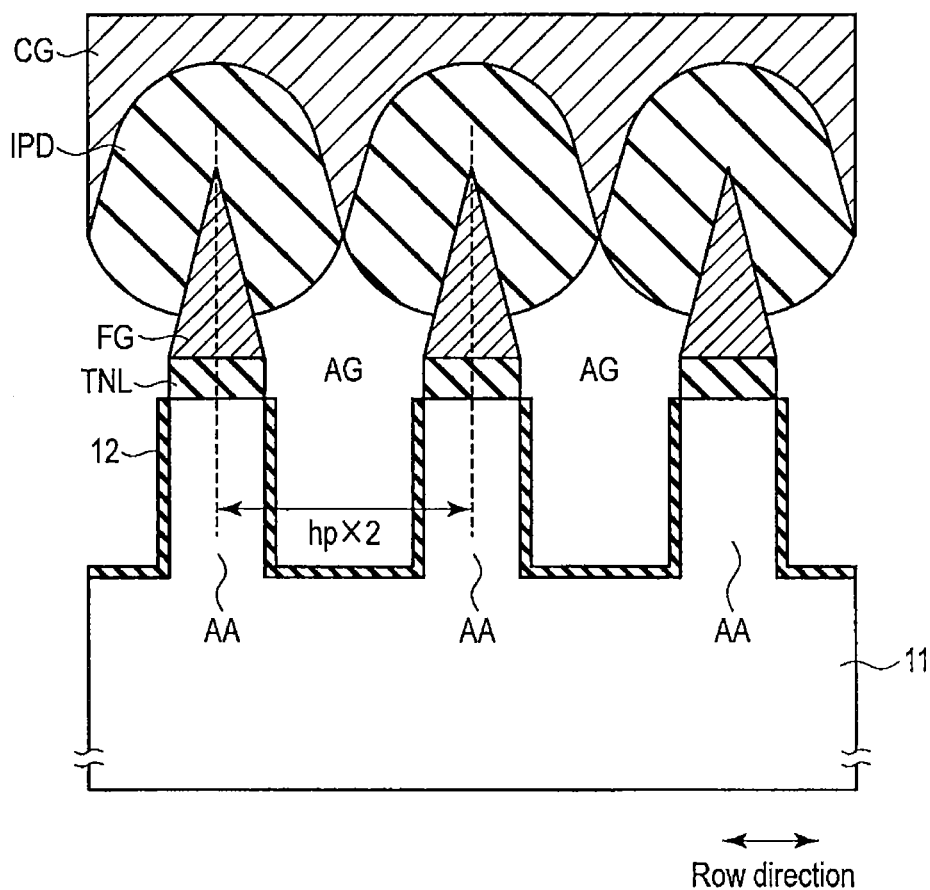
F I G. 8

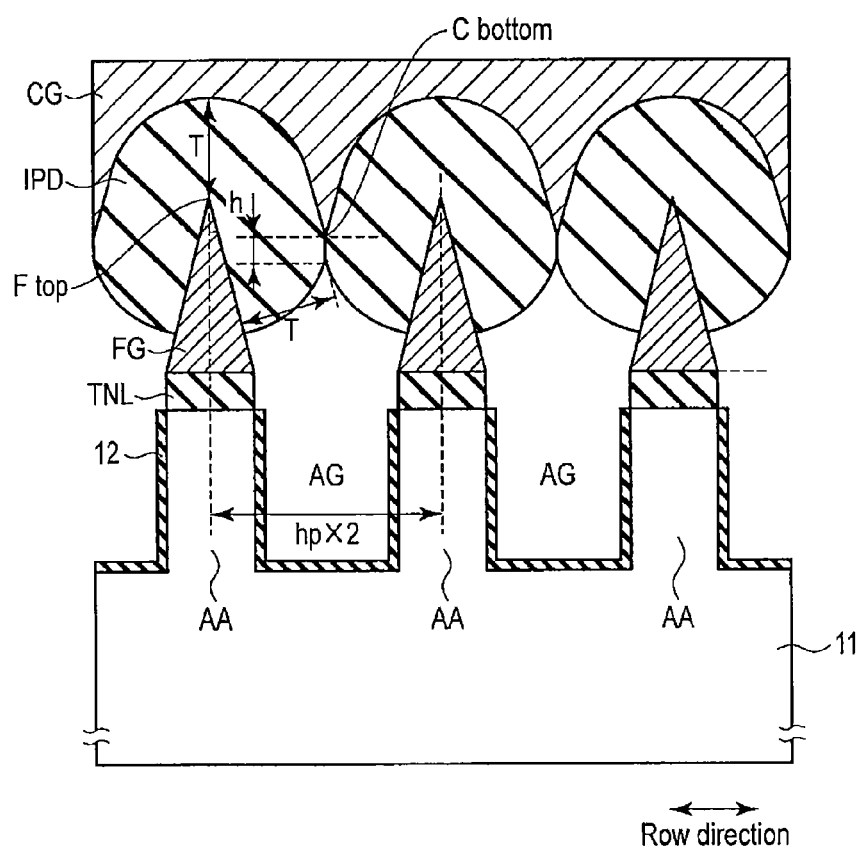
F I G. 9

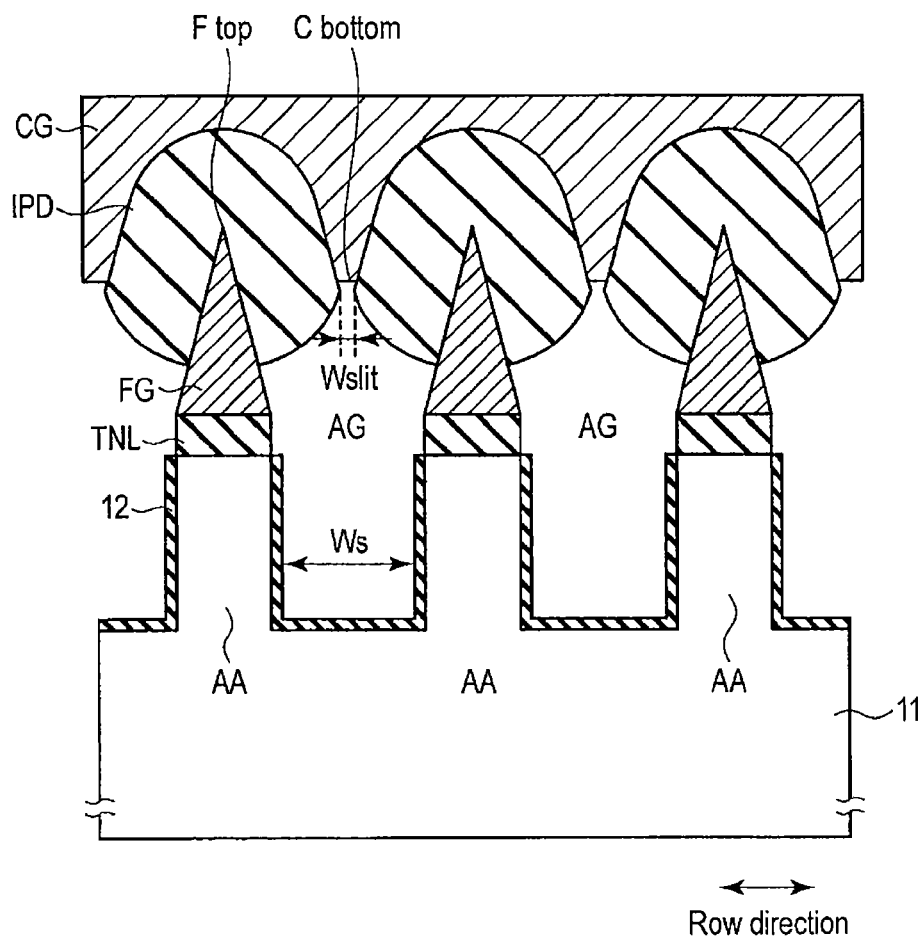
F I G. 12

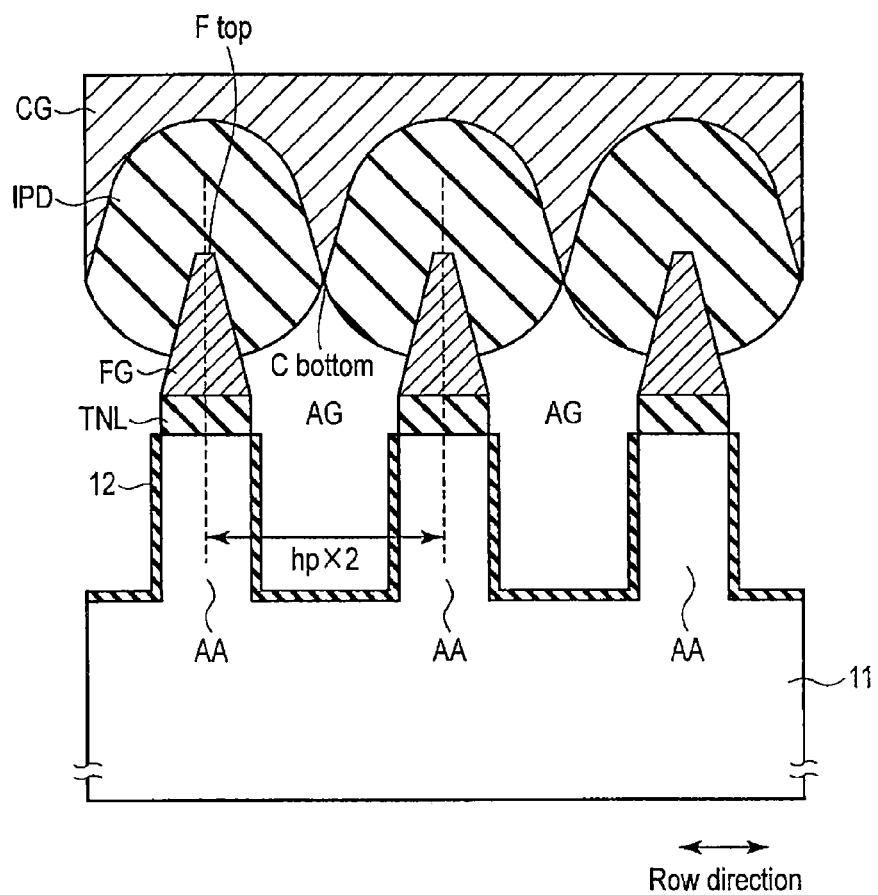
F I G. 13

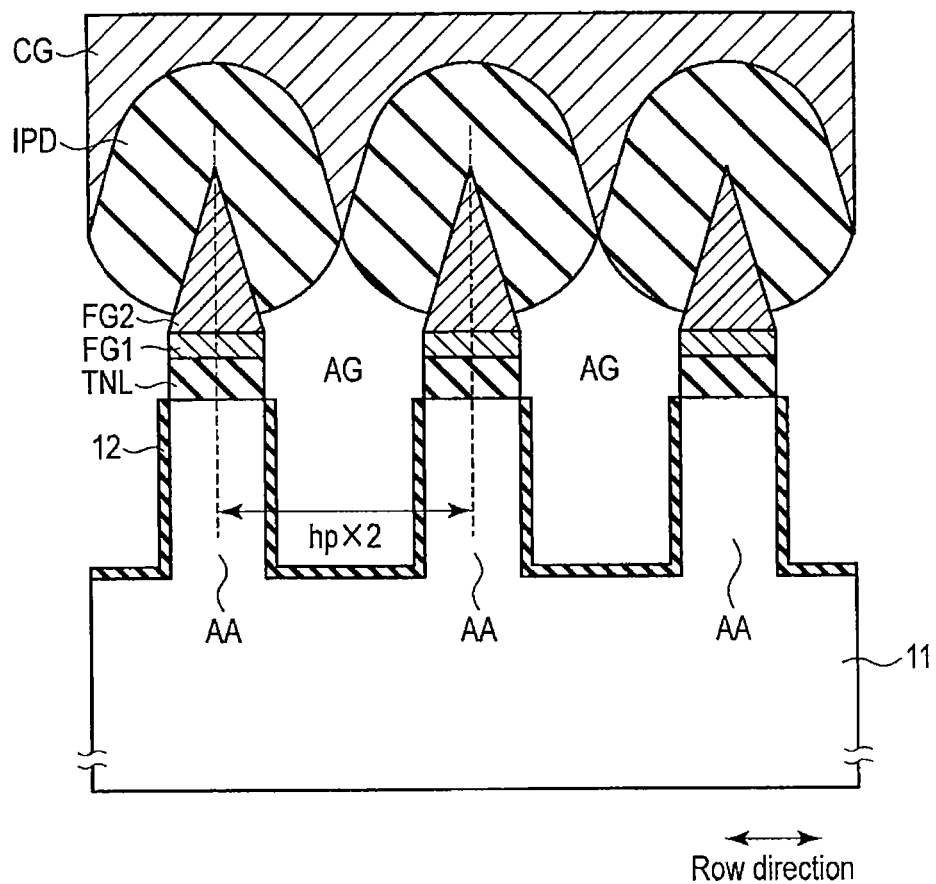
F I G. 15

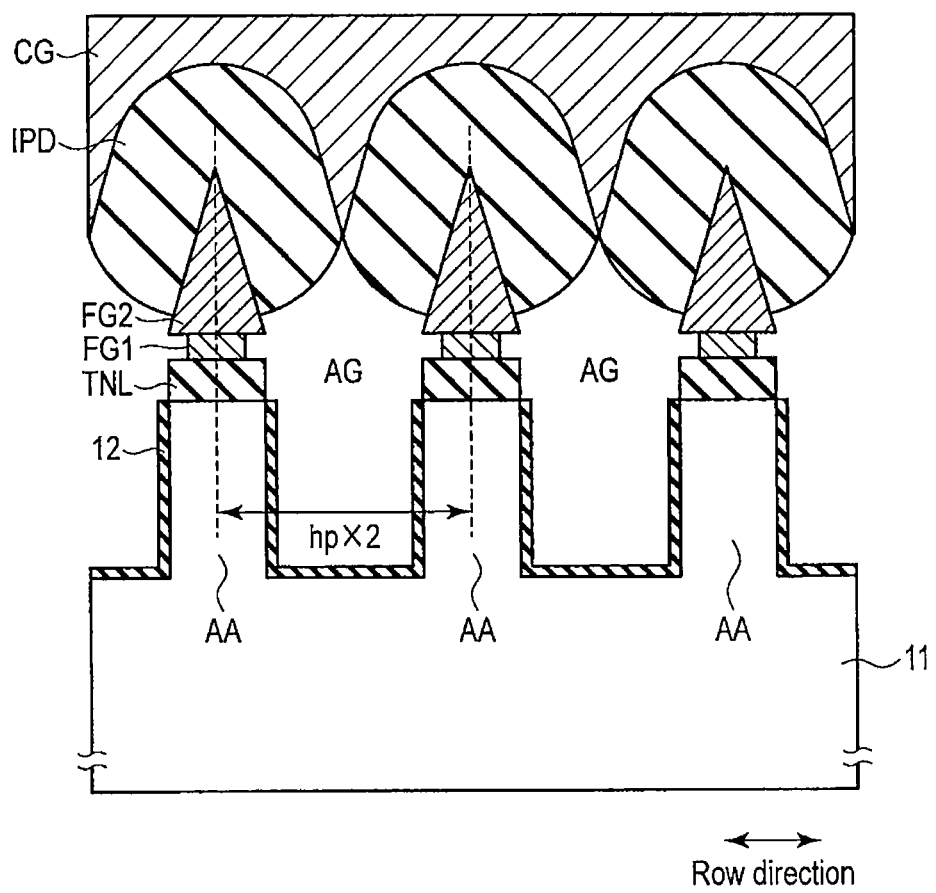
F I G. 16

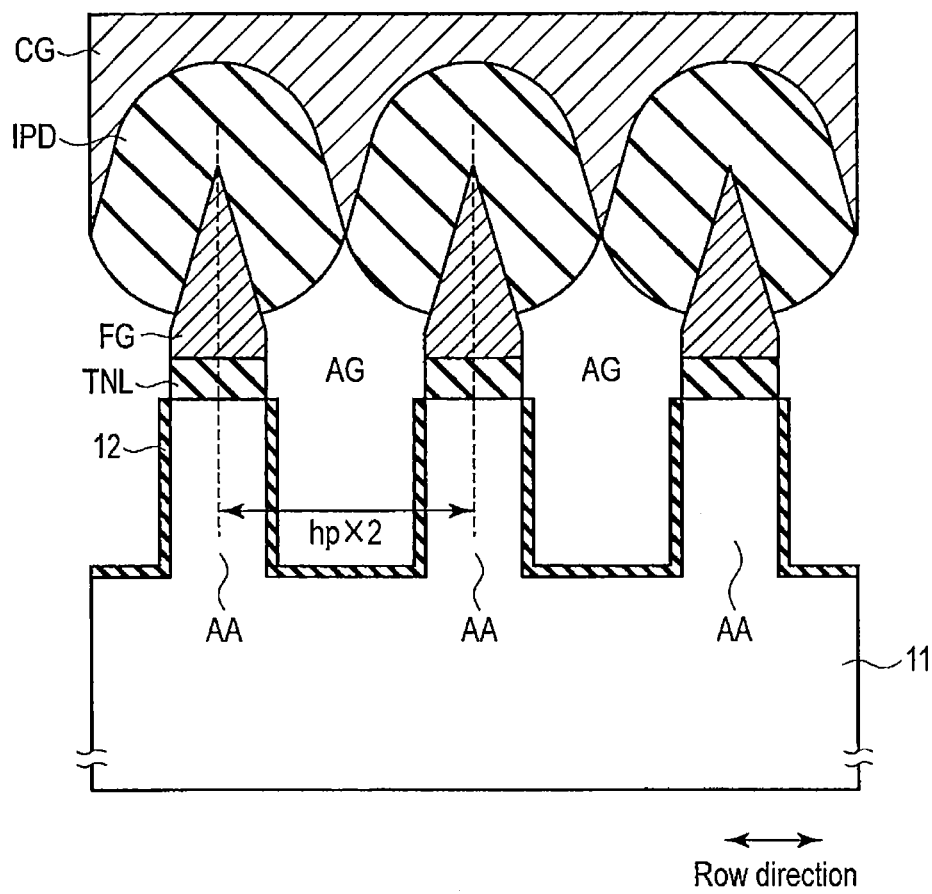
F I G. 17

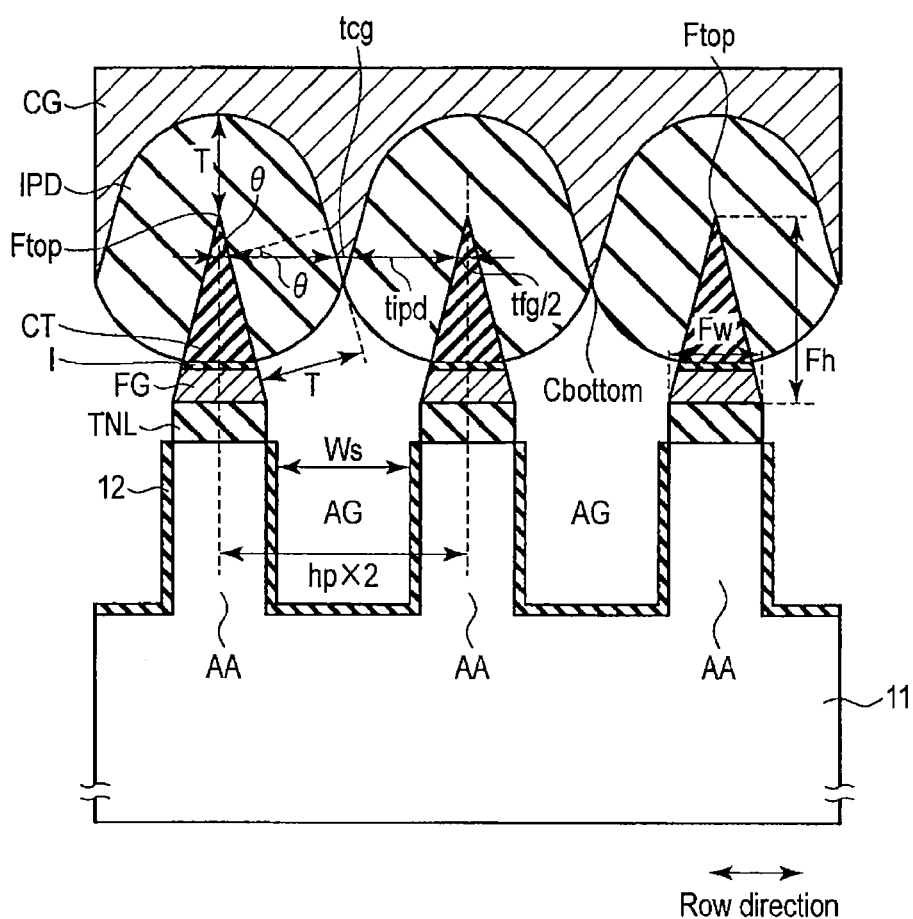
F I G. 20

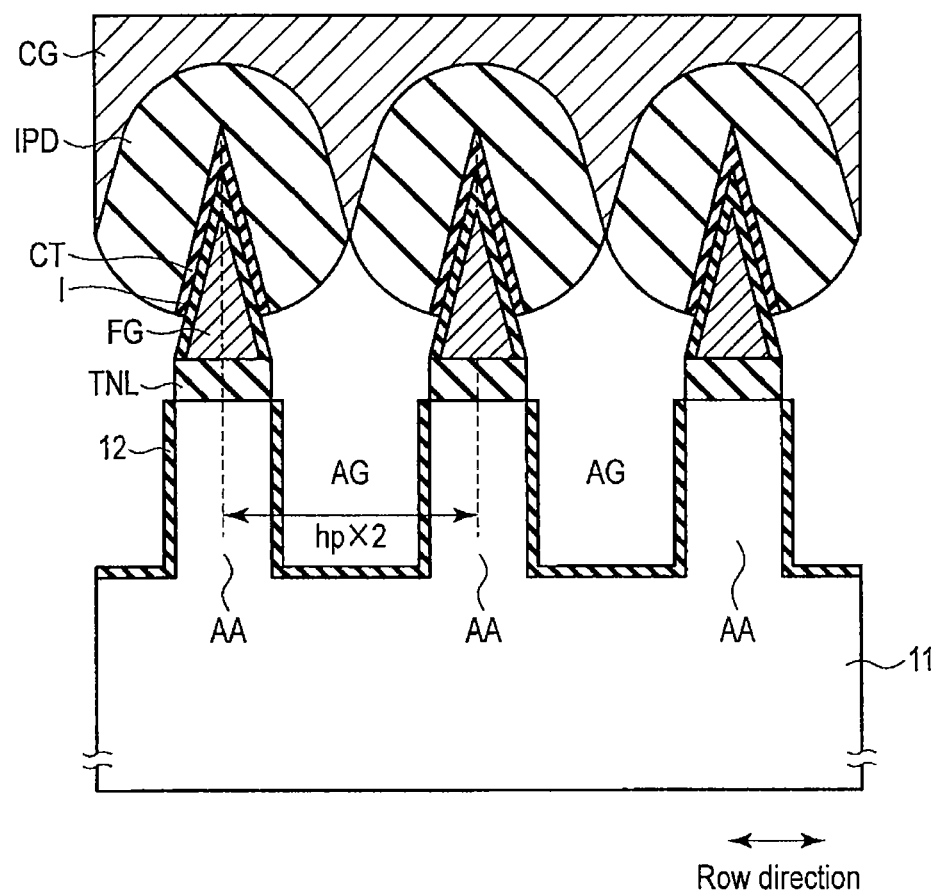
F I G. 23

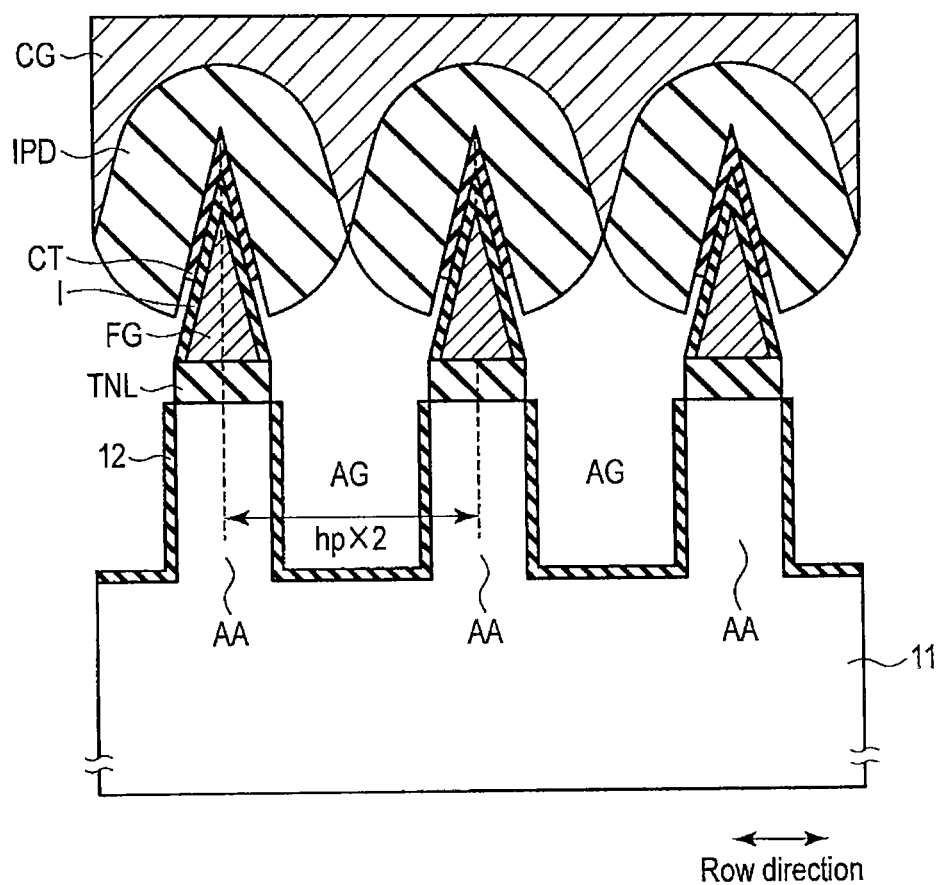
F I G. 24

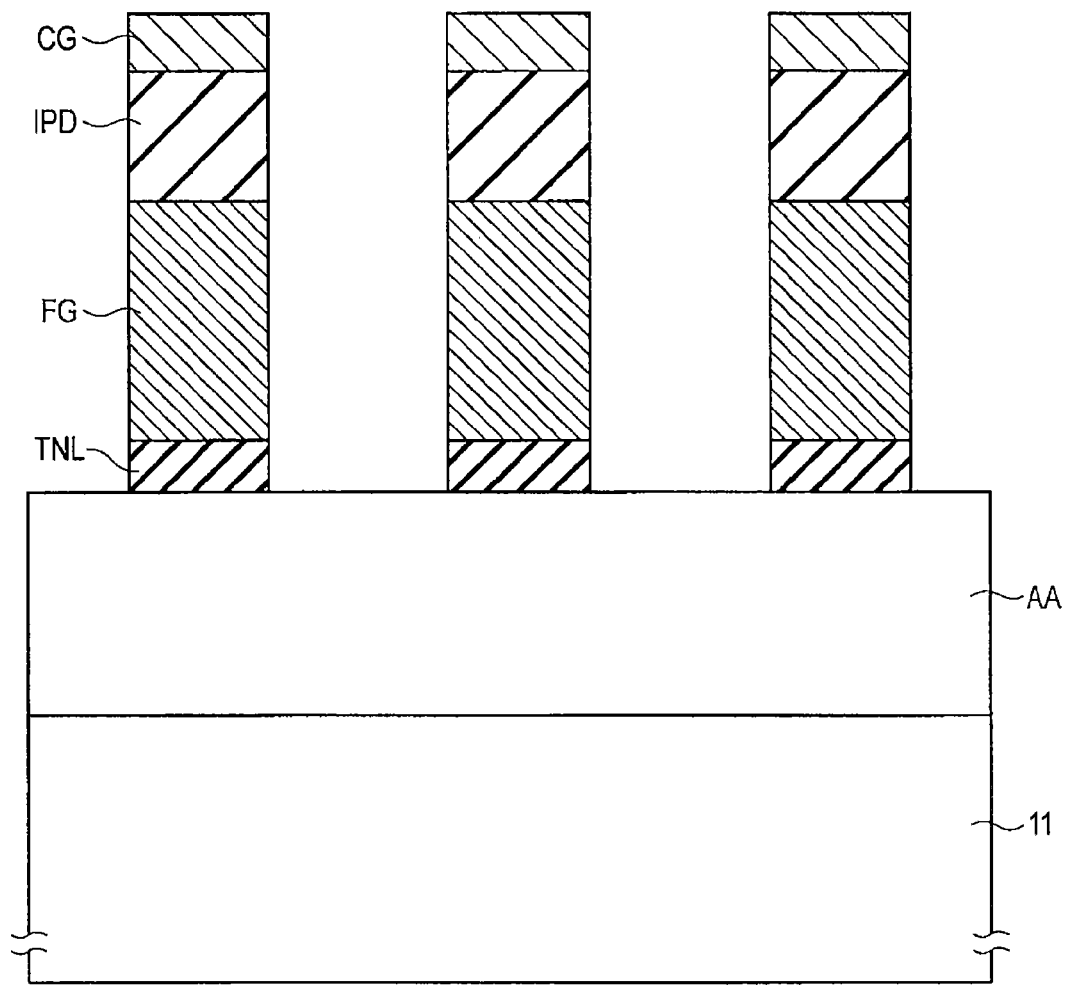
F I G. 28

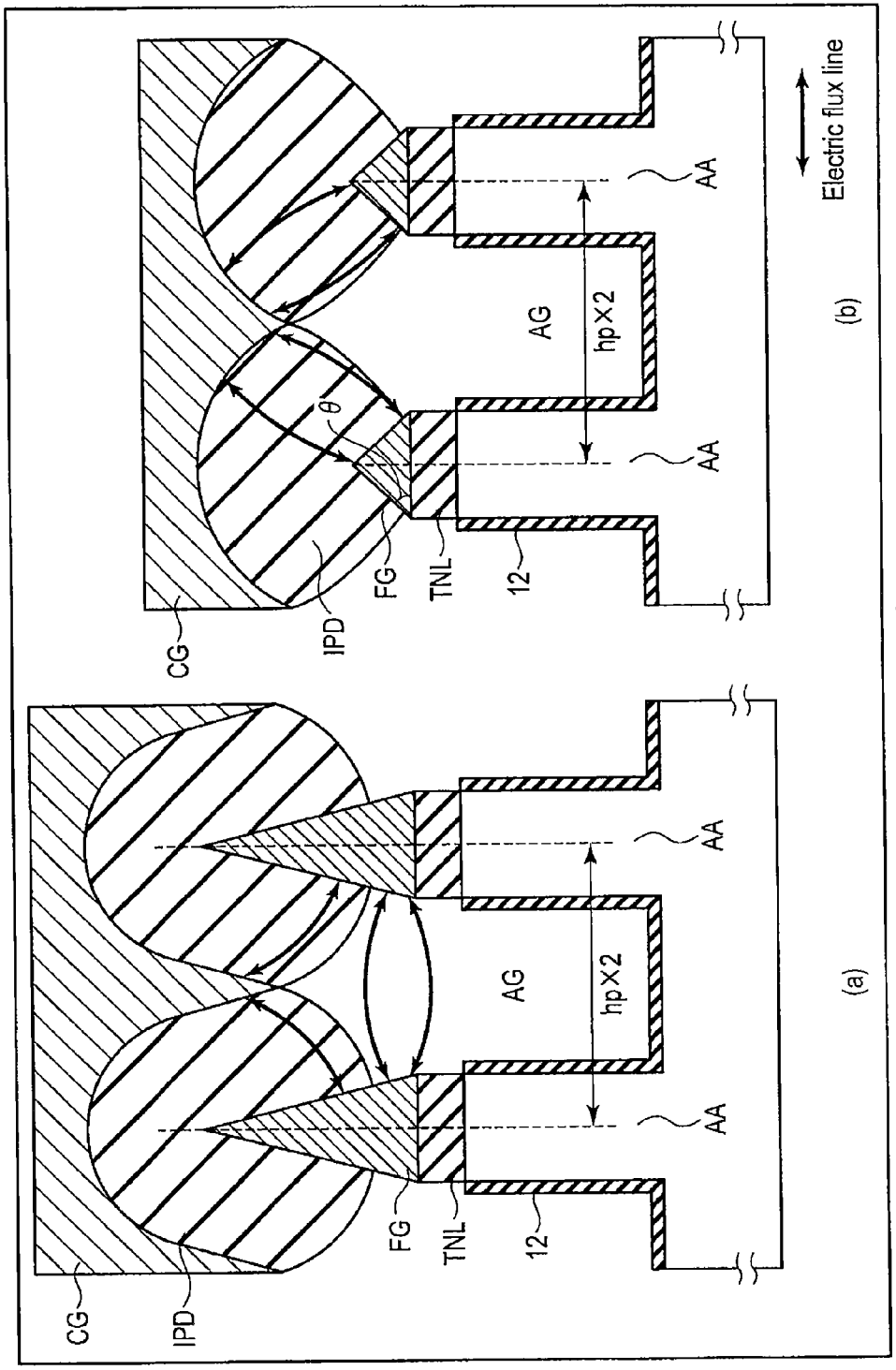
F I G. 30

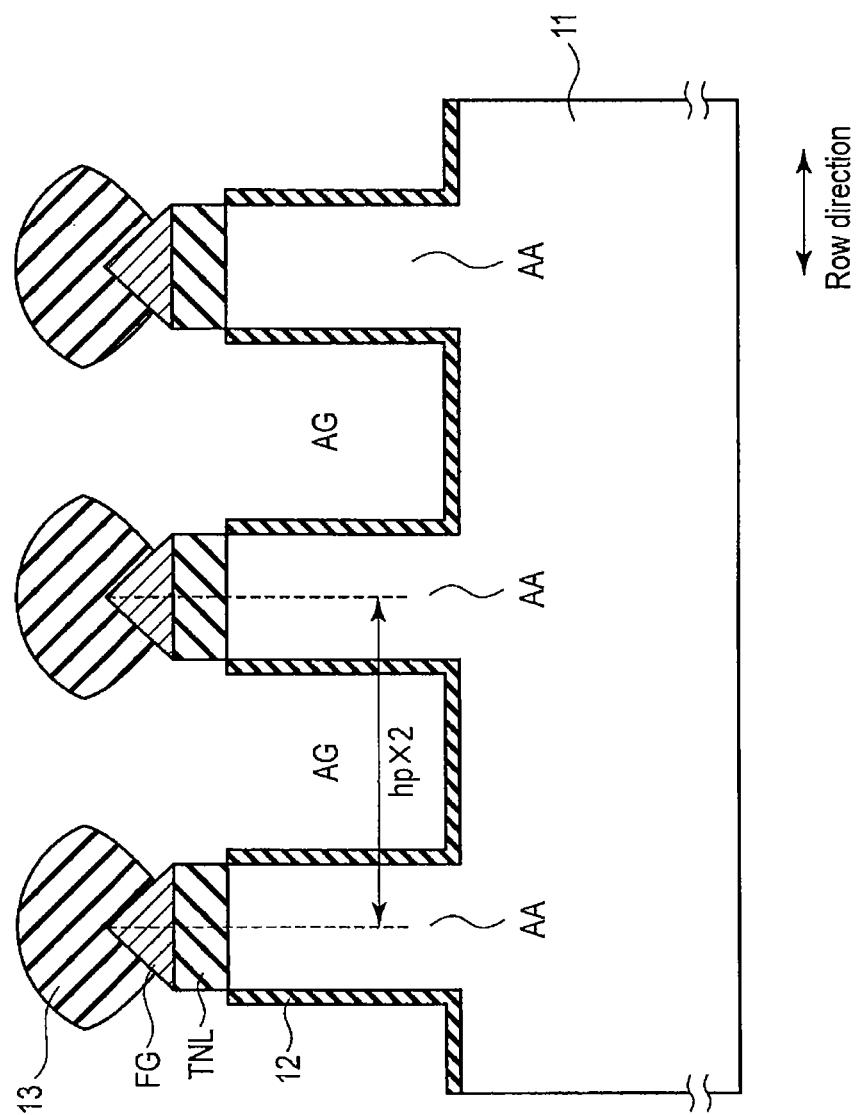
F I G. 33

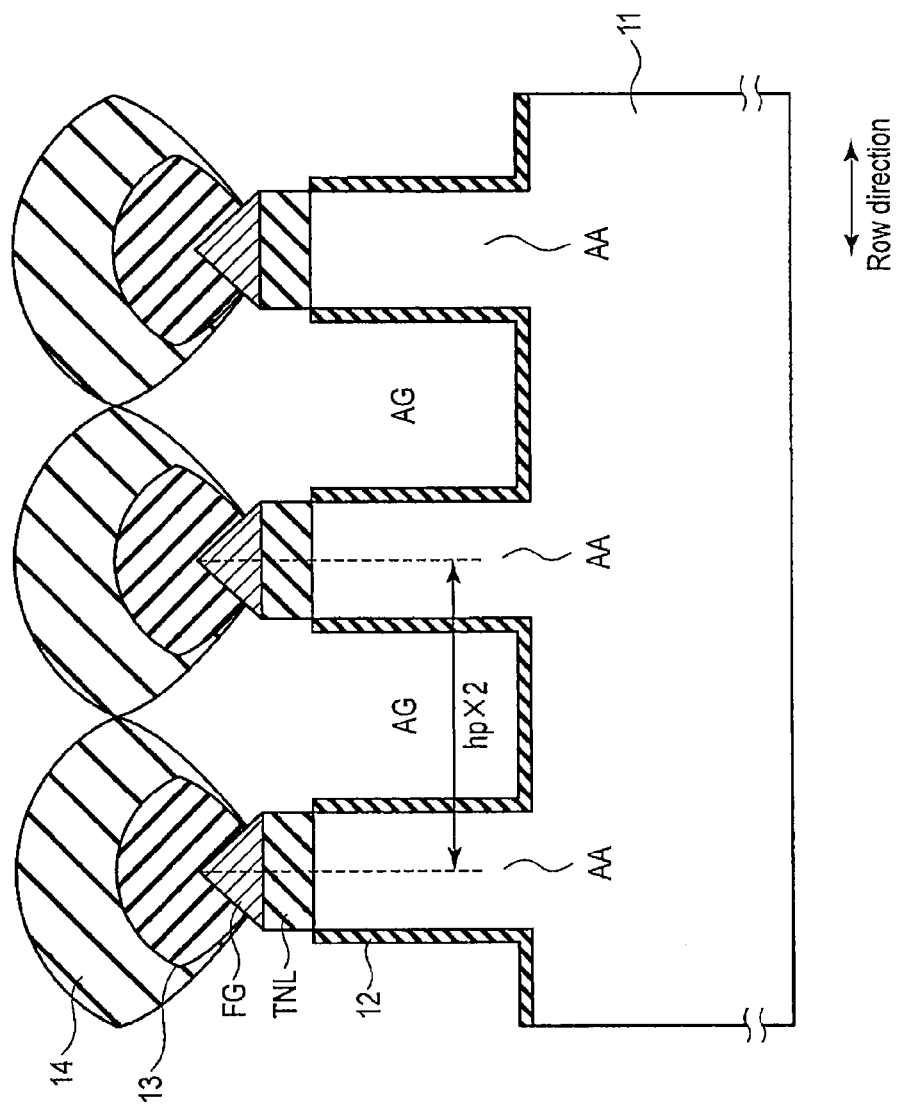
F I G. 34

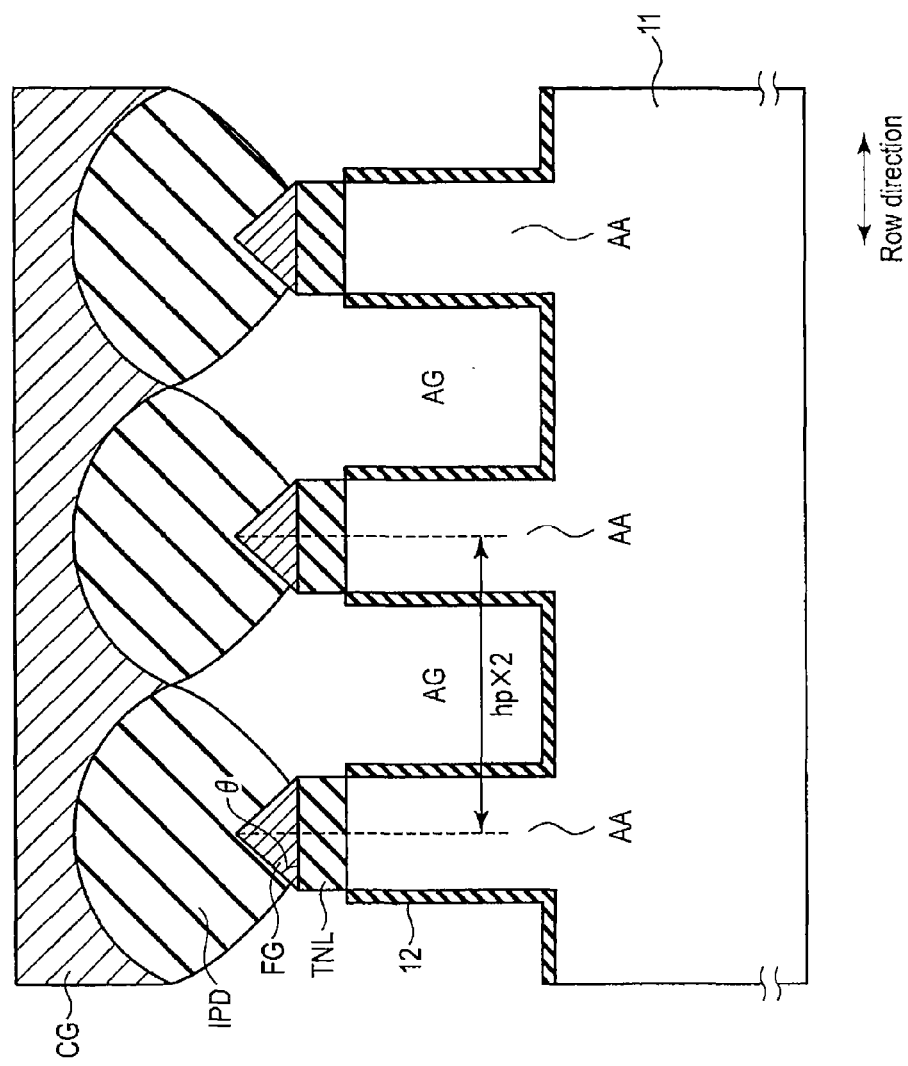
F I G. 36

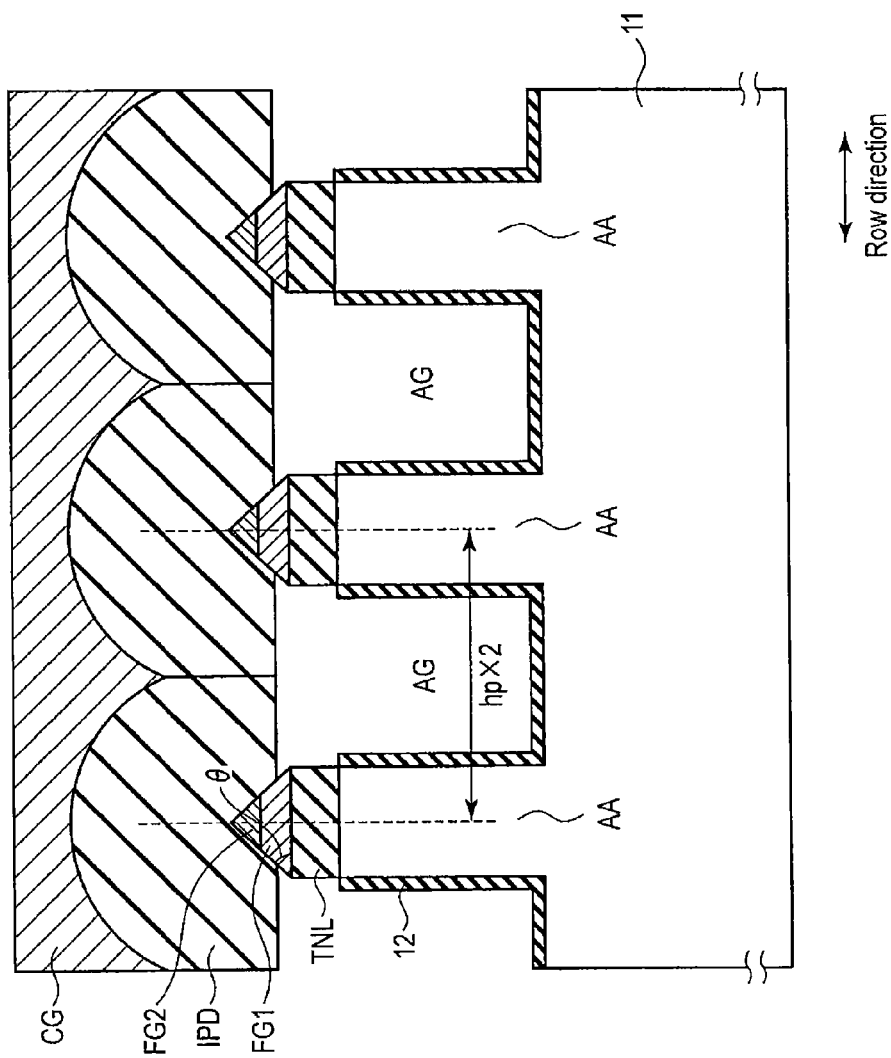
F I G. 44

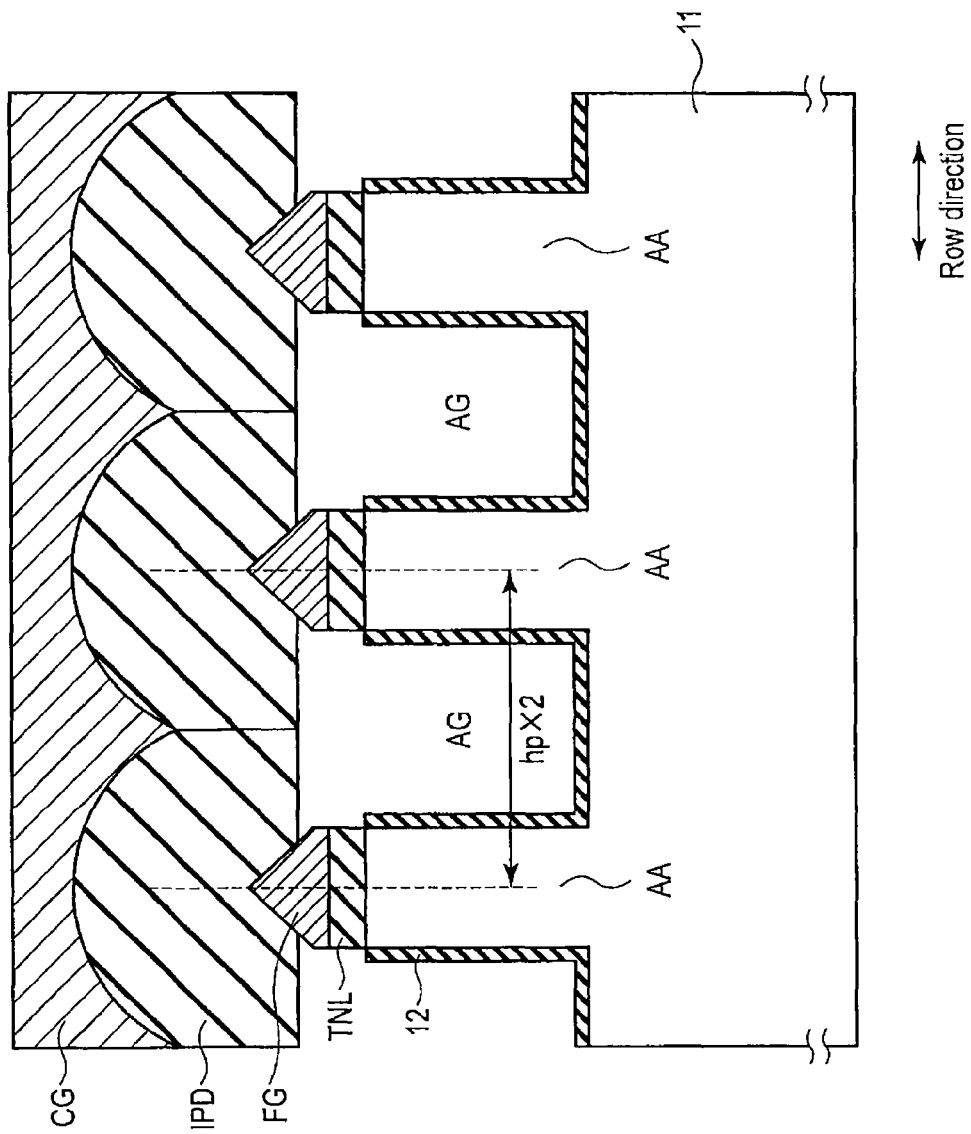
F I G. 45

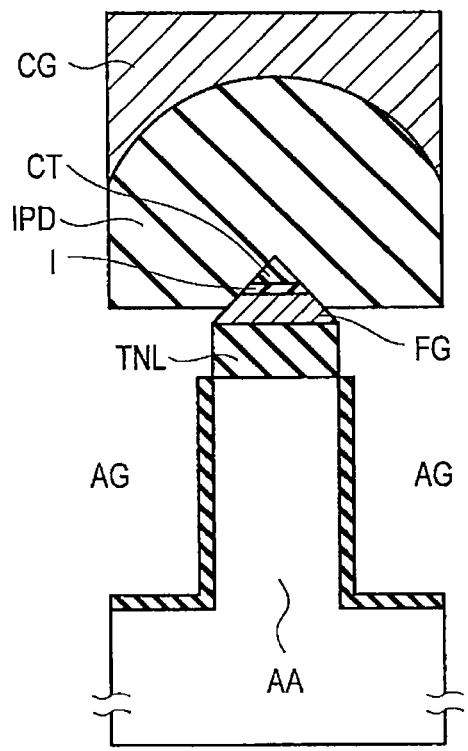
F I G. 47

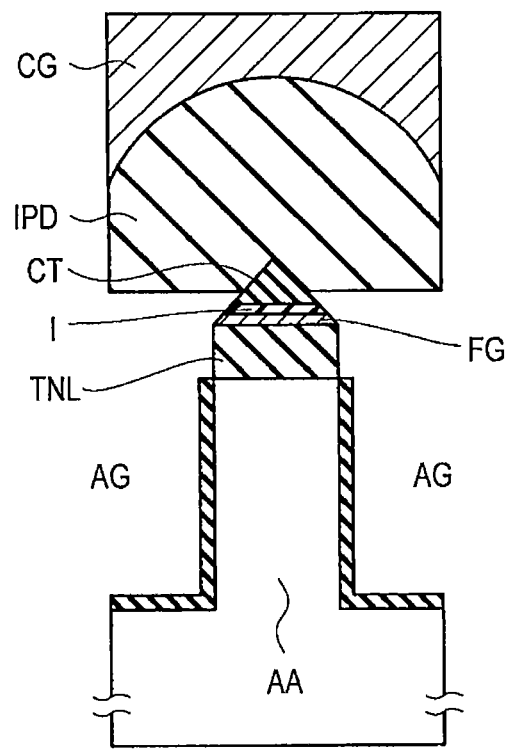
F I G. 48

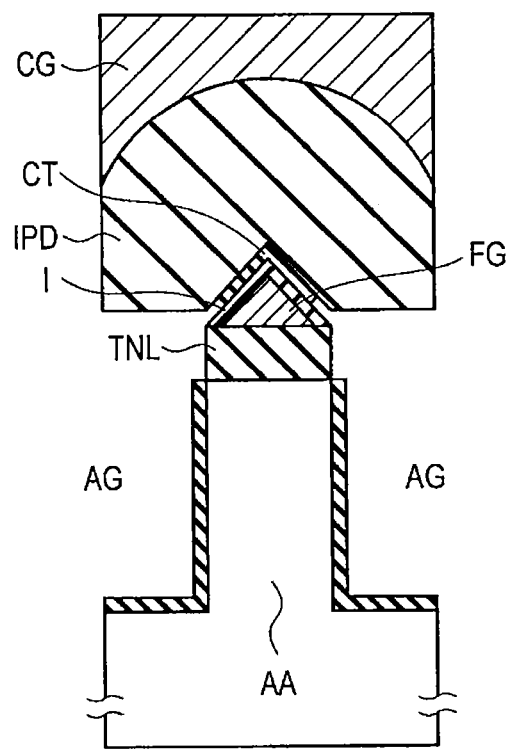
F I G. 5 0

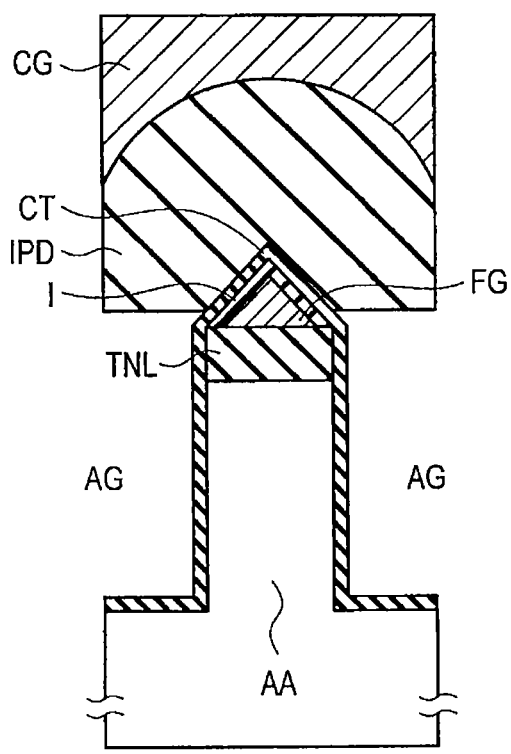
F I G. 5 1

US 8,890,231 B2

NONVOLATILE SEMICONDUCTOR MEMORY DEVICE WITH A NARROWING CHARGE STORAGE LAYER

CROSS-REFERENCE TO RELATED APPLICATIONS

This application is based upon and claims the benefit of priority from Japanese Patent Applications No. 2012-068335, filed Mar. 23, 2012; and No. 2012-068401, filed Mar. 23, 2012, the entire contents of all of which are incorporated herein by reference.

FIELD

Embodiments described herein relate generally to a nonvolatile semiconductor memory device and a method of manufacturing the same.

BACKGROUND

The flat cell structure, which is advantageous for finer structures, in a nonvolatile semiconductor storage device such as a NAND flash memory has recently gained attention again.

The flat cell structure has the advantage that half the pitch (half pitch) of bit lines extending in a column direction is not restricted by an inter-electrode insulating layer or a control gate electrode because the inter-electrode insulating layer or the control gate electrode does not get in between floating gate electrodes aligned in a row direction in which a control gate electrode (word line) extends.

However, an opposing area of the floating gate electrode and the control gate electrode is small in the flat cell structure and it is difficult to achieve a sufficiently large coupling ratio. Moreover, if the half pitch is narrowed by the flat cell structure, the so-called inter-cell interference in which memory cells aligned in the row direction interfere with each other in a read or write operation may be caused.

In addition, it is becoming more difficult to achieve a sufficiently large coupling ratio in the flat cell structure with increasingly finer structures of memory cells.

BRIEF DESCRIPTION OF THE DRAWINGS

FIG. 2 is a sectional view along a II-II line in FIG. 1;
FIG. 3 is a sectional view along a III-III line in FIG. 1;
FIGS. 4 to 8 are sectional views showing a manufacturing method;
FIG. 9 is a sectional view showing a first modification;
FIG. 12 is a sectional view showing a second modification;
FIG. 13 is a sectional view showing a third modification;
FIG. 15 is a sectional view showing a fifth modification;
FIG. 16 is a sectional view showing a sixth modification;
FIG. 17 is a sectional view showing a seventh modification;
FIG. 20 is a sectional view showing a tenth modification;
FIG. 23 is a sectional view showing a thirteenth modification;
FIG. 24 is a sectional view showing a fourteenth modification;
FIG. 28 is a sectional view along a III-III line in FIG. 26;
FIG. 30 is a diagram showing the relationship between the angle $\theta$ and electric lines of force;
FIGS. 32 to 36 are sectional views showing a manufacturing method;
FIG. 44 is a sectional view showing a fourth modification;
FIG. 45 is a sectional view showing a fifth modification;
FIG. 47 is a sectional view showing a seventh modification;
FIG. 48 is a sectional view showing an eighth modification;
FIG. 50 is a sectional view showing a tenth modification;
and
FIG. 51 is a sectional view showing an eleventh modification.

DETAILED DESCRIPTION

In general, according to one embodiment, a nonvolatile semiconductor memory device comprises: a semiconductor substrate; first and second fin-type active areas arranged on the semiconductor substrate aligned in a first direction, and extending in a second direction perpendicular to the first direction; a first memory cell on the first fin-type active area; and a second memory cell on the second fin-type active area, wherein the first memory cell includes a first gate insulating layer on the first fin-type active area, a first charge storage layer arranged on the first gate insulating layer and in which a width thereof in the first direction becomes narrower upward from below, a first inter-electrode insulating layer covering an upper portion of the first charge storage layer, and a control gate electrode arranged on the first inter-electrode insulating layer and extending in the first direction, the second memory cell includes a second gate insulating layer on the second fin-type active area, a second charge storage layer arranged on the second gate insulating layer and in which the width thereof in the first direction becomes narrower upward from below, a second inter-electrode insulating layer covering an upper portion of the second charge storage layer, and the control gate electrode arranged on the second inter-electrode insulating layer, the first and second inter-electrode insulating layers have a contact portion through which both are in contact with each other in the first direction, and thicknesses of the first and second inter-electrode insulating layers in the contact portion in a third direction perpendicular to the first and second directions are smaller than thicknesses of the first and second inter-electrode insulating layers in the third direction in top portions of the first and second charge storage layers respectively.

First Embodiment

Figure 1:
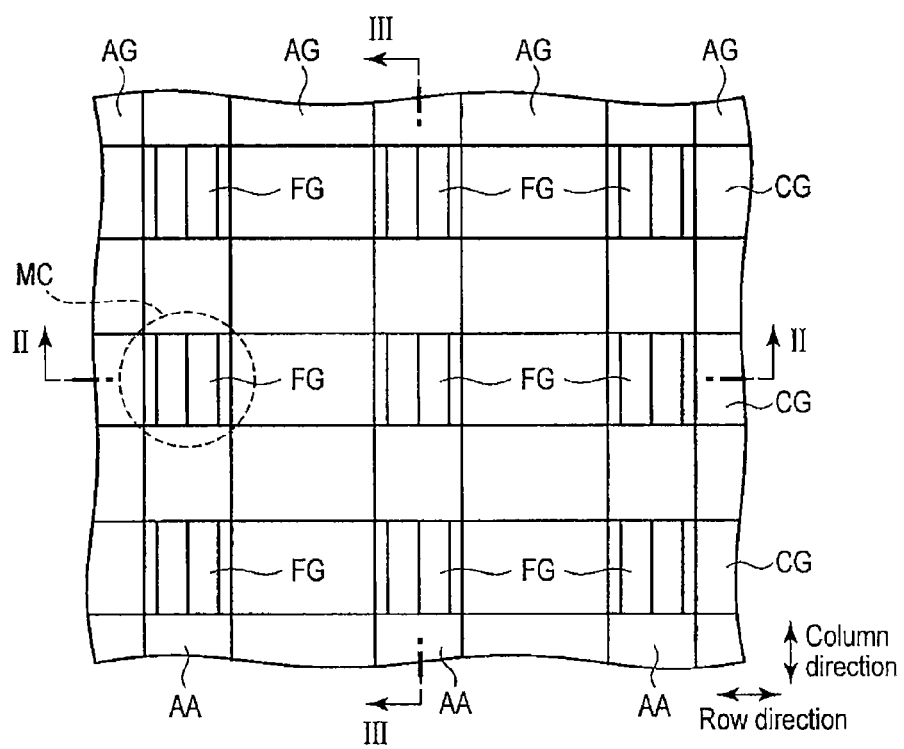
FIG. 1 is a plan view showing an array structure according to a first embodiment.

FIGS. 1 to 3 show an array structure.

FIG. 1 is a plan view of a memory cell array, FIG. 2 is a sectional view along a II-II line in FIG. 1, and FIG. 3 is a sectional view along a III-III line in FIG. 1.

Semiconductor substrate 11 is, for example, a silicon substrate. The upper surface of semiconductor substrate 11 has an irregular shape and projections form fin-type active areas AA. The fin-type active areas AA are aligned in the row direction (first direction) and also extend in the column direction (second direction) perpendicular to the row direction.

The upper surface (bottom of depressions) of semiconductor substrate 11 and the side face of the fin-type active areas AA may be covered with insulating layer 12. Insulating layer 12 is, for example, a layer of oxides formed by oxidizing semiconductor substrate 11. Insulating layer 12 prevents electrons in the fin-type active areas (channels) AA from escaping to an air gap AG.

In the present example, the fin-type active areas AA are a portion of semiconductor substrate 11, but are not limited to such an example. For example, the fin-type active areas AA may be a semiconductor layer such as an epitaxial layer on semiconductor substrate 11.

Memory cells (Field Effect Transistor: FET) MC are arranged on each fin-type active area AA. The memory cells MC on one fin-type active area AA constitutes a NAND string, for example, by being connected in series in the column direction.

Each memory cell MC includes a gate insulating layer (tunnel insulating layer) TNL on the fin-type active area AA, a floating gate electrode FG on the gate insulating layer TNL, an inter-electrode insulating layer IPD on the floating gate electrode FG, and a control gate electrode CG on the inter-electrode insulating layer IPD.

The gate insulating layer TNL is, for example, a silicon oxide layer and is formed by oxidizing the upper surface of the fin-type active area AA.

The floating gate electrode FG is, for example, a polysilicon layer, a metallic layer, or a lamination layer of these layers. The width of the floating gate electrode FG in the row direction gradually becomes narrower upward from below. In the present example, the floating gate electrode FG is a triangle of a base Fw and a height Fh, but the shape thereof is not limited to the above example. For example, the floating gate electrode FG may have a trapezoidal or semicircular shape.

However, the side face of the floating gate electrode FG in the row direction is desirably plane or curved.

By adopting a tapering shape upward from below for the shape of the floating gate electrode FG in this manner, inter-cell interference can be mitigated.

The side face of the floating gate electrode FG in the row direction may be covered with an insulating layer such as a layer of oxides. In such a case, the insulating layer covering the side face of the floating gate electrode FG in the row direction prevents electrons stored in the floating gate electrode FG from escaping to the air gap AG.

The inter-electrode insulating layer IPD covers an upper portion of the floating gate electrode FG. A space between lower portions of the floating gate electrode FG is the air gap AG. By creating the air gap AG between lower portions, particularly between lower edge portions, the effect of preventing the inter-cell interference can further be increased.

To improve the coupling ratio of memory cells, the inter-electrode insulating layer IPD includes a high dielectric constant material having a higher dielectric constant than, for example, a silicon oxide layer. The high dielectric constant material is, for example, a metallic oxide such as $Al_2O_3$, $ZrO_2$, $HfO_2$, HfSiO, HfAlO, LaAlO(LAO), and LaAlSiO (LASO) or a laminated structure of these. The high dielectric constant material may also be a laminated structure of a silicon oxide layer and a silicon nitride layer like ONO.

If the floating gate electrode FG and the control gate electrode CG contain a polysilicon layer, the inter-electrode insulating layer IPD may also be called an inter-polysilicon dielectric (IPD).

The control gate electrode CG includes a polysilicon layer, a metallic silicide layer, or a laminated structure of these. The control gate electrode CG and the inter-electrode insulating layer IPD extend in the row direction. The control gate electrode CG constitutes a word line.

In the above array structure, the two inter-electrode insulating layers IPD of two memory cells adjacent in the row direction share a contact portion through which both are in contact with each other The thickness (zero or almost zero in the present example) of the two inter-electrode insulating layers IPD in the contact portion in a vertical direction (third direction) perpendicular to the row direction and the column direction is smaller than a thickness T of the two inter-electrode insulating layers IPD in the vertical direction in top portions Ftop of the two floating gate electrodes FG of two memory cells adjacent in the row direction.

Accordingly, the control gate electrode CG has a bottom portion Cbottom in the contact portion of the two inter-electrode insulating layers IPD. The bottom portion Cbottom of the control gate electrode CG is below the top portion Ftop of the floating gate electrode FG.

Therefore, according to the present example, the inter-electrode insulating layer IPD and the control gate electrode CG can partially be inserted between the two floating gate electrodes FG. As a result, opposing portions of the floating gate electrode FG and the control gate electrode CG increase and thus, the coupling ratio of memory cells MC can be improved.

Moreover, according to the present example, like the flat cell structure, an advantage that a half pitch hp is not restricted by the inter-electrode insulating layer IPD and the control gate electrode CG is not lost. This will be described more concretely.

If half the distance (pitch of the active area AA) from the center of one active area AA to the center of another adjacent active area AA is defined as the half pitch hp, the half pitch hp can be represented as;

$$hp=(tfg+tcg)/2+tipd \tag{1}$$

If an imaginary line passing through the floating gate electrode FG in a portion (upper portion) covered with the inter-electrode insulating layer IPD and extending in the row direction is assumed, tfg is the width in the row direction of the floating gate electrode FG on the imaginary line, tcg is the width in the row direction of the control gate electrode CG on the imaginary line, and tipd is the width in the row direction of the inter-electrode insulating layer IPD on the imaginary line.

If the thickness of the inter-electrode insulating layer IPD in a direction perpendicular to the side face of the floating gate electrode FG in the row direction is T, T and tipd are related as:

$$tipd=T/\cos\theta \tag{2}$$

While tipd is almost constant regardless of the location, tfg and tcg change depending on the location. Moreover, tfg and tcg have a complementary relation and tcg decreases with increasing tfg and tcg increases with decreasing tfg.

That is, the present example is characterized in that even if the inter-electrode insulating layer IPD and the control gate electrode CG are partially inserted between the two floating gate electrodes FG, the half pitch hp is not restricted by the inter-electrode insulating layer IPD and the control gate electrode CG.

The half pitch hp corresponds to half the pitch of a bit line (not shown) arranged in the upper portion of the active area AA.

Also according to the present example, the half pitch hp is not restricted by the inter-electrode insulating layer IPD and the control gate electrode CG and thus, a thickness tipd in the row direction of the inter-electrode insulating layer IPD on the side face of the floating gate electrode FG in the row direction can be made larger than half a space Ws between active areas AA in the row direction.

In a conventional structure in which the inter-electrode insulating layer IPD and the control gate electrode CG getting in between the two floating gate electrodes FG, by contrast, the control gate electrode CG having a fixed thickness needs to be inserted into a fixed space between the two floating gate electrodes FG and thus, the thickness in the row direction of the inter-electrode insulating layer IPD cannot be made larger than half the space Ws between active areas AA in the row direction.

In the present example, an air gap is formed between the floating gate electrodes FG, but can be replaced by an insulating layer (for example, a silicon oxide layer) having a relative dielectric constant smaller than that of the inter-electrode insulating layer IPD. In addition, the charge storage layer of the memory cells MC is the floating gate electrode FG in the present example, but floating gate electrode FG can also be replaced by a charge trap layer (insulating layer) having a function to trap charges.

In the present example, the memory cells MC aligned in the column direction do not have a diffusion layer in the fin-type active area AA. This is because if each memory cell MC is made finer, a channel can be formed in the fin-type active area AA due to the so-called fringe effect without the diffusion layer.

However, each memory cell MC may have a diffusion layer in the fin-type active area AA.

According to an array structure in the present example, an increase in coupling ratio and prevention of inter-cell interference can be realized in the flat cell structure at the same time.

[Manufacturing Method]

The method of manufacturing a cell array structure according to the first embodiment will be described.

First, as shown in FIG. 4, the gate insulating layer TNL and the floating gate electrode FG are formed on semiconductor substrate 11. The gate insulating layer TNL is, for example, a silicon oxide layer and the floating gate electrode FG is, for example, a polysilicon layer.

Then, a photoresist layer is formed on the floating gate electrode FG by PEP (Photo Engraving Process). The photoresist layer has a line & space pattern aligned with a fixed pitch in the row direction and extending in the column direction.

Then, the floating gate electrode FG is patterned by RIE (Reactive Ion Etching) using the photoresist layer as a mask. The photoresist layer is removed and subsequently, the gate insulating layer TNL and semiconductor substrate 11 are etched by dry etching using the floating gate electrode FG as a mask.

As a result, the active area AA having a line & space pattern aligned with a fixed pitch (2× half pitch hp) in the row direction and extending in the column direction is formed. At the same time, the floating gate electrode FG is partially etched to form the floating gate electrode FG in a tapering shape upward from below.

Then, the surface of semiconductor substrate 11 is covered with insulating layer 12. Insulating layer 12 may be a natural oxidation layer. The surface of the floating gate electrode FG may also be covered with an insulating layer such as a natural oxidation layer.

In place of the above process, the floating gate electrode FG, the gate insulating layer TNL, and semiconductor substrate 11 may successively be etched by RIE using the photoresist layer as a mask. In this case, after the etching, etching to form the floating gate electrode FG into a tapering shape is performed.

Next, as shown in FIG. 5, insulating layer (for example, a silicon oxide layer) 13 is formed only on an upper portion of the floating gate electrode FG by using a film formation method with poor coverage such as the sputter process and CVD method. Subsequently, as shown in FIG. 6, insulating layer (for example, a lanthanum aluminate layer) 14 is formed only on insulating layer 13 on the upper portion of the floating gate electrode FG by using a film formation method with poor coverage such as the sputter process and CVD method.

Then, two insulating layers 13, 14 are made to react by, for example, heat treatment to form, as shown in FIG. 7, one insulating layer (for example, a lanthanum aluminosilicate layer) as the inter-electrode insulating layer IPD.

Lastly, as shown in FIG. 8, the control gate electrode CG is formed on the inter-electrode insulating layer IPD. The control gate electrode CG is formed by, for example, the following process.

An electrode material is formed on the inter-electrode insulating layer IPD and a mask layer is formed on the electrode material. The mask layer has a line & space pattern aligned with a fixed pitch in the column direction and extending in the row direction.

Then, each of the electrode material and the inter-electrode insulating layer IPD is patterned by RIE using the mask layer as a mask. At this point, the floating gate electrode FG present in a region that is not covered with the mask layer is also etched.

That is, the floating gate electrodes FG of memory cells connected in series in the column direction are isolated from each other.

The mask layer is, for example, a hard mask layer to perform a sidewall patterning process (double patterning process). The process is known as a technology to realize a narrow line width or a narrow line pitch.

With the above manufacturing method, the cell array structure according to the first embodiment is completed.

[First Modification]

FIG. 9 shows a cell array structure according to the first modification.

FIG. 9 corresponds to the sectional view (FIG. 2) in the row direction according to the first embodiment.

The cell array structure according to the present example is different from the cell array structure according to the first embodiment in that a thickness h in the vertical direction of a contact portion of two inter-electrode insulating layers IPD of two memory cells adjacent in the row direction exceeds zero.

However, like the first embodiment described above, the thickness h in the vertical direction of the two inter-electrode insulating layers IPD in the contact portion is desirably smaller than a thickness T of the two inter-electrode insulating layers IPD in the vertical direction in top portions Ftop of two floating gate electrodes FG of two memory cells adjacent in the row direction.

The present example is the same as the first embodiment in other respects and thus, the description thereof is omitted.

Figure 10:
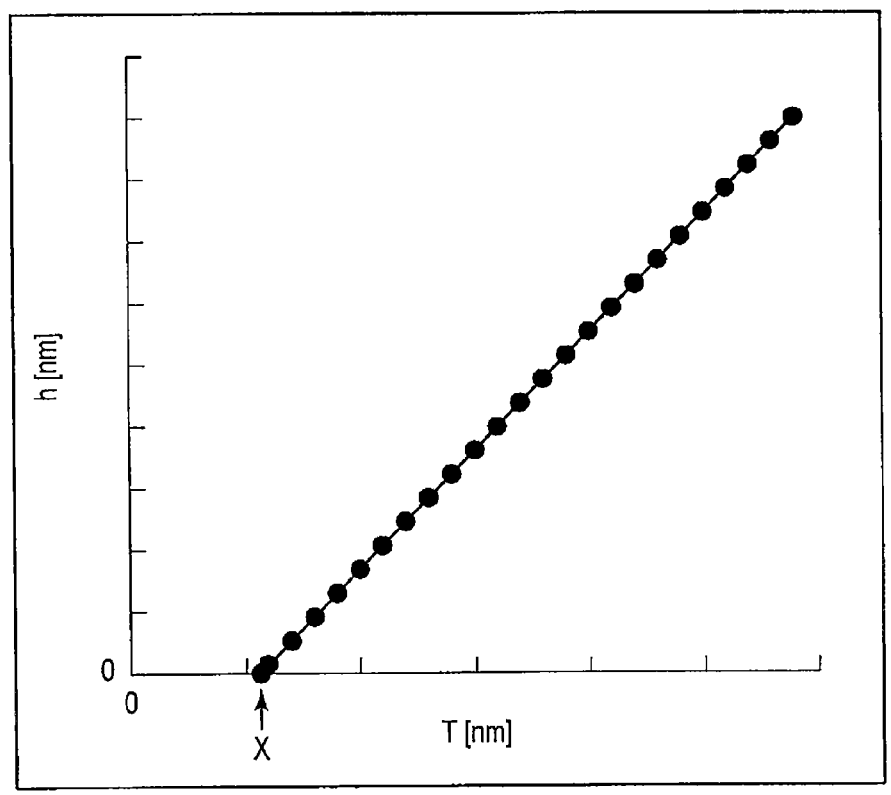
FIG. 10 is diagram showing a relationship between the thickness of an inter-electrode insulating layer and a height of a contact portion.

FIG. 10 shows a relationship between the thickness T of the inter-electrode insulating layer and the thickness h of the contact portion.

As is evident from FIG. 10, when the thickness T of the inter-electrode insulating layer IPD is a predetermined value X, the two inter-electrode insulating layers IPD of two memory cells adjacent in the row direction are in contact with each other. If the thickness T of the inter-electrode insulating layer IPD exceeds X, the thickness h of the contact portion of the two inter-electrode insulating layers IPD increases in proportion to an increase in thickness T of the inter-electrode insulating layer IPD.

Figure 11:
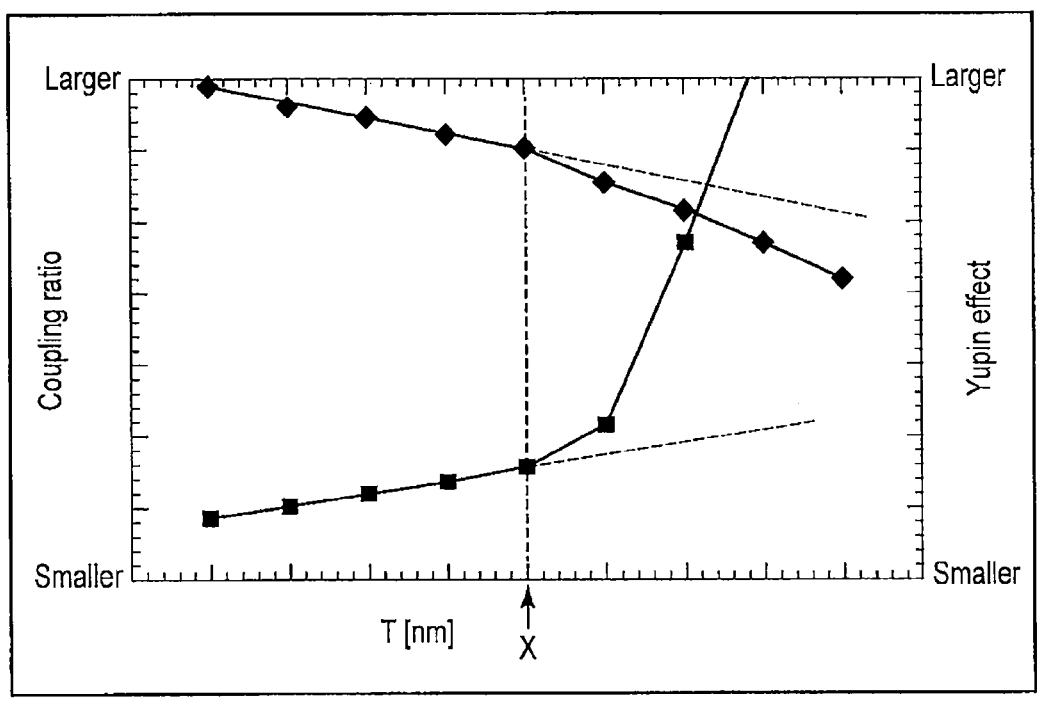
FIG. 11 is a diagram showing dependence of a coupling ratio and inter-cell interference on the thickness of the inter-electrode insulating layer.

FIG. 11 shows relationships between a coupling ratio and inter-cell interference and the thickness T of the inter-electrode insulating layer.

In FIG. 11, shows the relationship between the coupling ratio and the thickness T of the inter-electrode insulating layer and shows the relationship between the inter-cell interference and the thickness T of the inter-electrode insulating layer.

An increasing coupling ratio of memory cells is more desirable, but if the thickness T of the inter-electrode insulating layer IPD exceeds X, the coupling ratio decreases rapidly. This can be considered to be caused by a decreasing opposing area of the floating gate electrode FG and the control gate electrode CG with an increasing thickness h of the contact portion of the two inter-electrode insulating layers IPD. That is, the coupling ratio increases with an increasing opposing area of both and thus, the increasing thickness h of the contact portion invites a decrease in coupling ratio.

Decreasing inter-cell interference (Yupin effect) is more desirable, but if the thickness T of the inter-electrode insulating layer IPD exceeds X, the inter-cell interference increases rapidly. This can be considered to be caused by disappearance of an air gap present between the two inter-electrode insulating layers IPD after both come into contact with each other. That is, the relative dielectric constant of the inter-electrode insulating layer IPD is generally larger than the relative dielectric constant of an air gap and thus, if the two inter-electrode insulating layers IPD come into contact, inter-cell interference increases.

In a conventional structure (rocket structure), the inter-electrode insulating layer IPD having a fixed thickness is formed along the side face of the two adjacent floating gate electrodes FG and thus, the two adjacent floating gate electrodes FG electrically interfere with each other via 2× (inter-electrode insulating layer having a fixed thickness).

According to the present modification, by contrast, the thickness h in the contact portion of the two adjacent inter-electrode insulating layers IPD is sufficiently smaller than the thickness T of the inter-electrode insulating layer and thus excels in preventing inter-cell interference.

It is more desirable that the thickness h in the contact portion be smaller than half the thickness T (T/2) of the inter-electrode insulating layer IPD.

In a conventional structure, the inter-electrode insulating layer IPD has a laminated structure of silicon oxide and silicon nitride and the relative dielectric constant thereof is about 4 to 5.

In the present modification, by contrast, a material containing oxide of, for example, La, Hf, and Al is used for the inter-electrode insulating layer IPD with a large relative dielectric constant to increase the coupling ratio. In this case, the relative dielectric constant of the inter-electrode insulating layer IPD is assumed to be still larger than 9, which of the relative dielectric constant of thin alumina.

Thus, according to the present modification, even if the relative dielectric constant of the inter-electrode insulating layer IPD is twice the relative dielectric constant of a conventional structure or more, a material having such a large relative dielectric constant can be prevented from being arranged between the two adjacent floating gate electrodes FG by making the thickness h in the contact portion of the two adjacent inter-electrode insulating layers IPD smaller than half the thickness T (T/2) of the inter-electrode insulating layer IPD.

Therefore, the present modification is effective in preventing inter-cell interference.

If the relative dielectric constant of the inter-electrode insulating layer IPD according to the present modification is about N times the relative dielectric constant of 4 to 5 in a conventional structure, setting h<T/N is a desirable condition for realizing a large coupling ratio and prevention of inter-cell interference at the same time.

What can be learned from the above is that in order to achieve an increase in coupling ratio and prevention of inter-cell interference, the thickness h of the contact portion when the two inter-electrode insulating layers IPD of two memory cells adjacent in the row direction are in contact with each other is desirably as small as possible.

From the above consideration, it is clear that it is desirable to set the thickness T of the inter-electrode insulating layer IPD to less than X and to provide an opening between the two inter-electrode insulating layers IPD of two memory cells adjacent in the row direction without allowing the two inter-electrode insulating layers IPD to come into contact.

[Second Modification]

FIG. 12 shows a cell array structure according to the second modification.

FIG. 12 corresponds to the sectional view (FIG. 2) in the row direction according to the first embodiment.

The cell array structure according to the present example is different from the cell array structure according to the first embodiment in that with an opening formed between two inter-electrode insulating layers IPD of two memory cells adjacent in the row direction, these inter-electrode insulating layers IPD are isolated from each other.

The width in the row direction of the opening between the two inter-electrode insulating layers IPD of two memory cells adjacent in the row direction is Wsilt.

The width Wsilt is desirably narrower than a width Ws in the row direction of two active areas AA adjacent in the row direction.

According to the present example, the effect of an increase in coupling ratio and prevention of inter-cell interference can further be improved.

[Third Modification]

FIG. 13 shows a cell array structure according to the third modification.

FIG. 13 corresponds to the sectional view (FIG. 2) in the row direction according to the first embodiment.

The cell array structure according to the present example is different from the cell array structure according to the first embodiment in that a top portion of a floating gate electrode FG is flat.

That is, the section of the floating gate electrode FG in the row direction is trapezoidal. A bottom portion Cbottom of a control gate electrode CG is below the top portion Ftop of the floating gate electrode FG.

The bottom portion Cbottom of the control gate electrode CG may be above the top portion Ftop of the floating gate electrode FG, but as described above, the bottom portion Cbottom of the control gate electrode CG is desirably below the top portion Ftop of the floating gate electrode FG to improve the coupling ratio.

Also according to the present example, an increase in coupling ratio and prevention of inter-cell interference can be realized at the same time.

[Fourth Modification]

Figure 14:
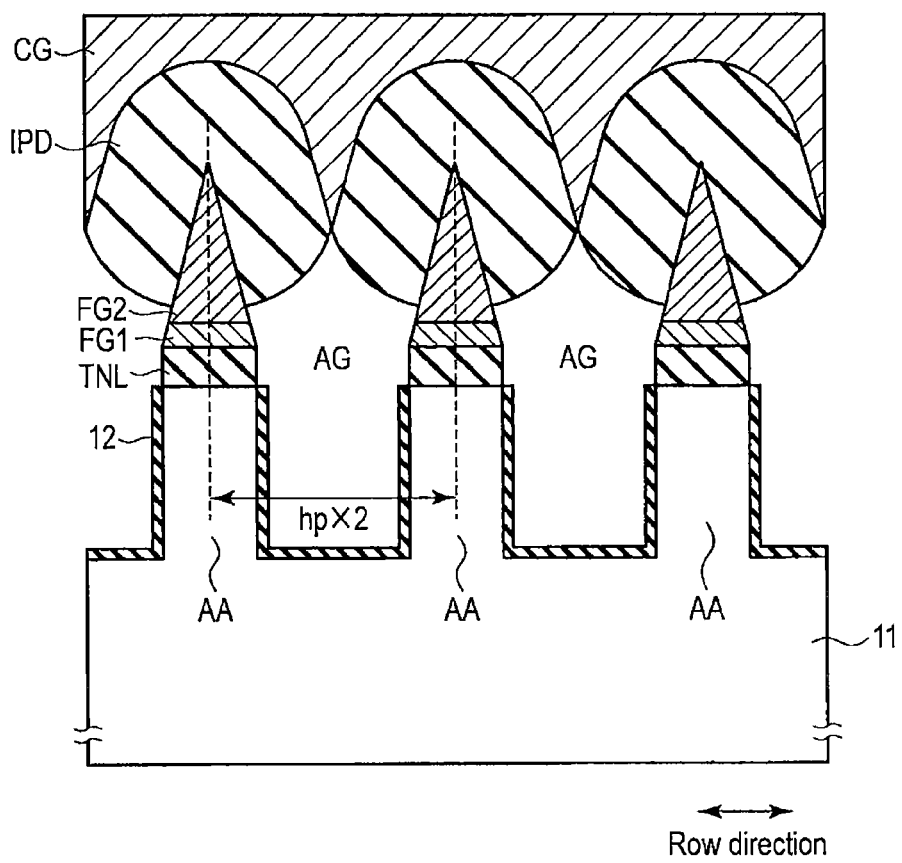
FIG. 14 is a sectional view showing a fourth modification.

FIG. 14 shows a cell array structure according to the fourth modification.

FIG. 14 corresponds to the sectional view (FIG. 2) in the row direction according to the first embodiment.

The cell array structure according to the present example is different from the cell array structure according to the first embodiment in that a floating gate electrode FG has a multilayer structure.

That is, the floating gate electrode FG includes a first conductive layer FG1 on a gate insulating layer TNL and a second conductive layer FG2 on the first conductive layer FG1.

The first conductive layer FG1 is, for example, a polysilicon layer. The second conductive layer FG2 is, for example, a titanium layer, tungsten layer, tantalum layer, titanium nitride layer, tungsten nitride layer, or tantalum nitride layer. The first and second conductive layers FG1, FG2 are not limited to the above materials, but have mutually different materials.

Mutually different materials include a case when the first conductive layer FG1 contains a portion or all of compositions of the second conductive layer FG2.

The above case is, for example, a case when the second conductive layer FG2 is a titanium layer, tungsten layer, or tantalum layer and the first conductive layer FG1 is a titanium silicide layer, tungsten silicide layer, or tantalum silicide layer.

At least the upper portion of the second conductive layer FG2 is completely covered with the inter-electrode insulating layer IPD, but the entire second conductive layer FG2 may be covered with the inter-electrode insulating layer IPD or a portion of the first conductive layer FG1 may be covered with the inter-electrode insulating layer IPD.

Also according to the present example, an increase in coupling ratio and prevention of inter-cell interference can be realized at the same time.

[Fifth Modification]

FIG. 15 shows a cell array structure according to the fifth modification.

FIG. 15 corresponds to the sectional view (FIG. 2) in the row direction according to the first embodiment.

The present example is a further modification of the fourth modification. The cell array structure according to the present example is different from the cell array structure according to the fourth modification in that the side face of the first conductive layer FG1 in the row direction is not inclined (tapered) and is almost perpendicular to the upper surface of semiconductor substrate 11.

Whether the shape of the floating gate electrode FG is like in the fourth modification or the fifth modification depends on the materials of the first and second conductive layers FG1, FG2 and conditions for patterning the floating gate electrode FG.

At least the upper portion of the second conductive layer FG2 is completely covered with the inter-electrode insulating layer IPD, but the entire second conductive layer FG2 may be covered with the inter-electrode insulating layer IPD or a portion of the first conductive layer FG1 may be covered with the inter-electrode insulating layer IPD.

Also according to the present example, an increase in coupling ratio and prevention of inter-cell interference can be realized at the same time.

[Sixth Modification]

FIG. 16 shows a cell array structure according to the sixth modification.

FIG. 16 corresponds to the sectional view (FIG. 2) in the row direction according to the first embodiment.

The present example is a further modification of the fourth or fifth modification. The cell array structure according to the present example is different from the cell array structure according to the fourth or fifth modification in that the width of the first conductive layer FG1 in the row direction is narrower than the width of the bottom portion (bottom) of the second conductive layer FG2 in the row direction.

The structure of the present example can easily be formed by selectively performing recess etching of only the first conductive layer FG1 after the floating gate electrode FG being patterned.

By narrowing the width of the first conductive layer FG1 in the row direction in this manner, inter-cell interference can further be prevented.

At least the upper portion of the second conductive layer FG2 is completely covered with the inter-electrode insulating layer IPD, but the entire second conductive layer FG2 may be covered with the inter-electrode insulating layer IPD or a portion of the first conductive layer FG1 may be covered with the inter-electrode insulating layer IPD.

Also according to the present example, an increase in coupling ratio and prevention of inter-cell interference can be realized at the same time.

[Seventh Modification]

FIG. 17 shows a cell array structure according to the seventh modification.

FIG. 17 corresponds to the sectional view (FIG. 2) in the row direction according to the first embodiment.

The cell array structure according to the present example is different from the cell array structure according to the first embodiment in that the side face in a lower portion of the floating gate electrode FG in the row direction is not inclined (tapered) and is almost perpendicular to the upper surface of semiconductor substrate 11.

Whether the shape of the floating gate electrode FG is like in the first embodiment or the present example depends on the materials constituting the floating gate electrode FG and conditions for patterning the floating gate electrode FG.

Also according to the present example, an increase in coupling ratio and prevention of inter-cell interference can be realized at the same time.

[Eighth Modification]

Figure 18:
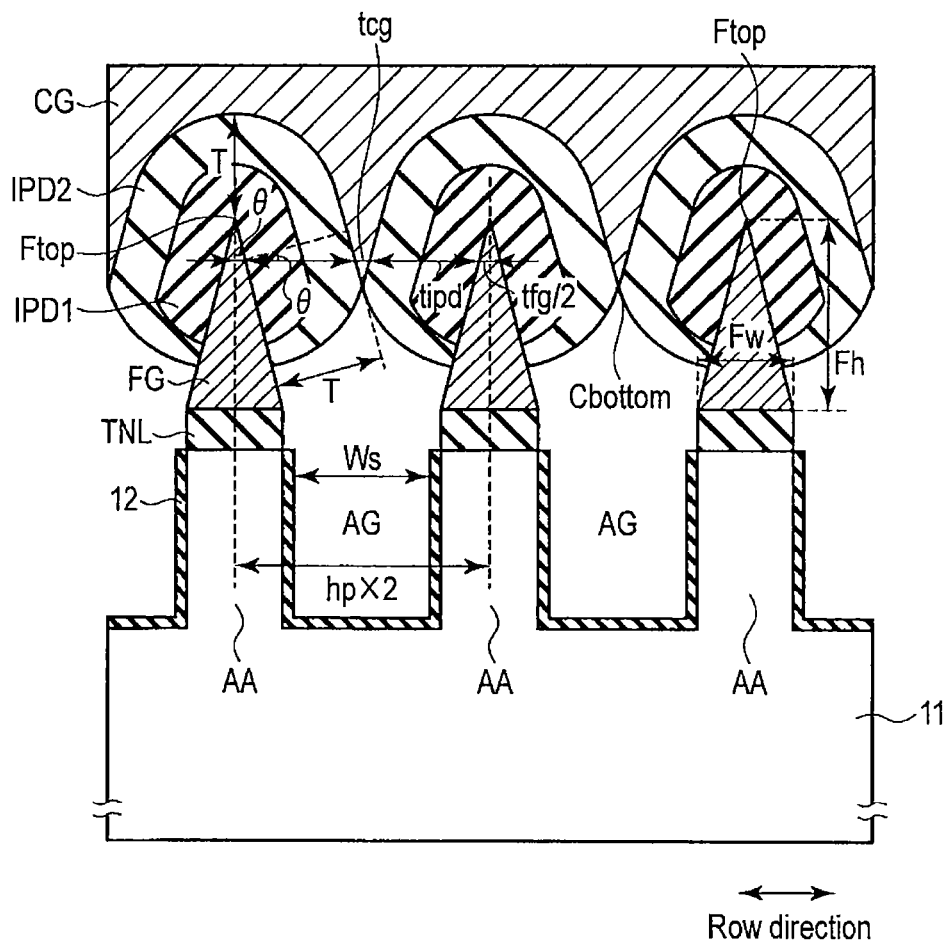
FIG. 18 is a sectional view showing an eighth modification.

FIG. 18 shows a cell array structure according to the eighth modification.

FIG. 18 corresponds to the sectional view (FIG. 2) in the row direction according to the first embodiment.

The cell array structure according to the present example is different from the cell array structure according to the first embodiment in that an inter-electrode insulating layer has a multilayer structure.

That is, in the present example, the inter-electrode insulating layer includes a first insulating layer IPD1 and a second insulating layer IPD2 constituted of mutually different materials. Mutually different materials include a case when one of the first and second insulating layers IPD1, IPD2 contains a portion or all of elements constituting the other.

A case when the first and second insulating layers IPD1, IPD2 have the same component elements, but have different composition ratios is also assumed to be mutually different materials.

In the present example, the inter-electrode insulating layer has two layers, but the present example is not limited to such an example. That is, the inter-electrode insulating layer may have three layers or more.

Also according to the present example, an increase in coupling ratio and prevention of inter-cell interference can be realized at the same time.

[Ninth Modification]

Figure 19:
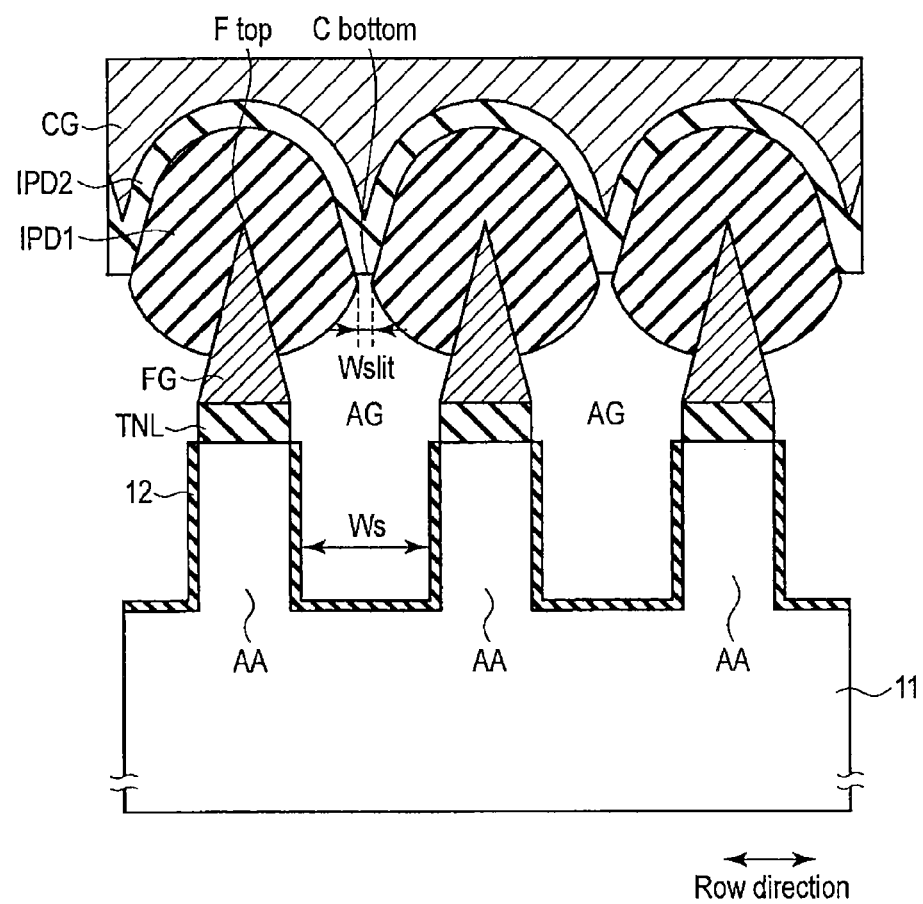
FIG. 19 is a sectional view showing a ninth modification.

FIG. 19 shows a cell array structure according to the ninth modification.

FIG. 19 corresponds to the sectional view (FIG. 2) in the row direction according to the first embodiment.

The present example is a combination of the second modification and the eighth modification. The cell array structure according to the present example is characterized in that an inter-electrode insulating layer (second insulating layer) IPD2 is further formed as if to close an opening (width: Wslit) between two inter-electrode insulating layers (first insulating layer) IPD1 of two memory cells adjacent in the row direction.

Like the eighth modification, the first and second insulating layers IPD1, IPD2 desirably include mutually different materials. In the present example, the two first insulating layers IPD1 adjacent in the row direction are isolated via the opening, but both may be in contact with each other.

Also according to the present example, an increase in coupling ratio and prevention of inter-cell interference can be realized at the same time.

[Tenth Modification]

FIG. 20 shows a cell array structure according to the tenth modification.

FIG. 20 corresponds to the sectional view (FIG. 2) in the row direction according to the first embodiment.

The cell array structure according to the present example is different from the cell array structure according to the first embodiment in that a charge storage layer of a memory cell includes a floating gate electrode FG as a conductive layer in an electrically floating state and a charge trap layer CT as an insulating layer arranged on the floating gate electrode FG to trap charges.

For example, the floating gate electrode FG whose sectional shape in the row direction is trapezoidal is arranged on a gate insulating layer (tunnel insulating layer) TNL. Further, the charge trap layer CT whose sectional shape in the row direction is triangular is arranged on the floating gate electrode FG.

The floating gate electrode FG includes, as described above, a polysilicon layer, a metallic layer, or a lamination layer of these layers. The charge trap layer CT includes an insulating layer of SiN, SiON, $Al_2O_3$, HfO or the like.

In the present example, an insulating layer (ultra-thin insulating layer) I of, for example, 10 nm or less in thickness is arranged between the floating gate electrode FG and the charge trap layer CT. The insulating layer I may be omitted.

The charge trap layer CT is completely covered with an inter-electrode insulating layer IPD, but a portion of the charge trap layer CT may be covered with the inter-electrode insulating layer IPD or a portion of the floating gate electrode FG may be covered with the inter-electrode insulating layer IPD.

The above structure is called the so-called hybrid type.

According to the hybrid type, the charge storage layer of a memory cell includes the floating gate electrode FG and the charge trap layer CT. The charge trap layer CT has a function to raise a potential barrier by trapping charges and thus has an effect of preventing a leak current between two charge storage layers adjacent in the row or column direction.

The present example can realize an increase in coupling ratio and prevention of inter-cell interference at the same time.

[Eleventh Modification]

Figure 21:
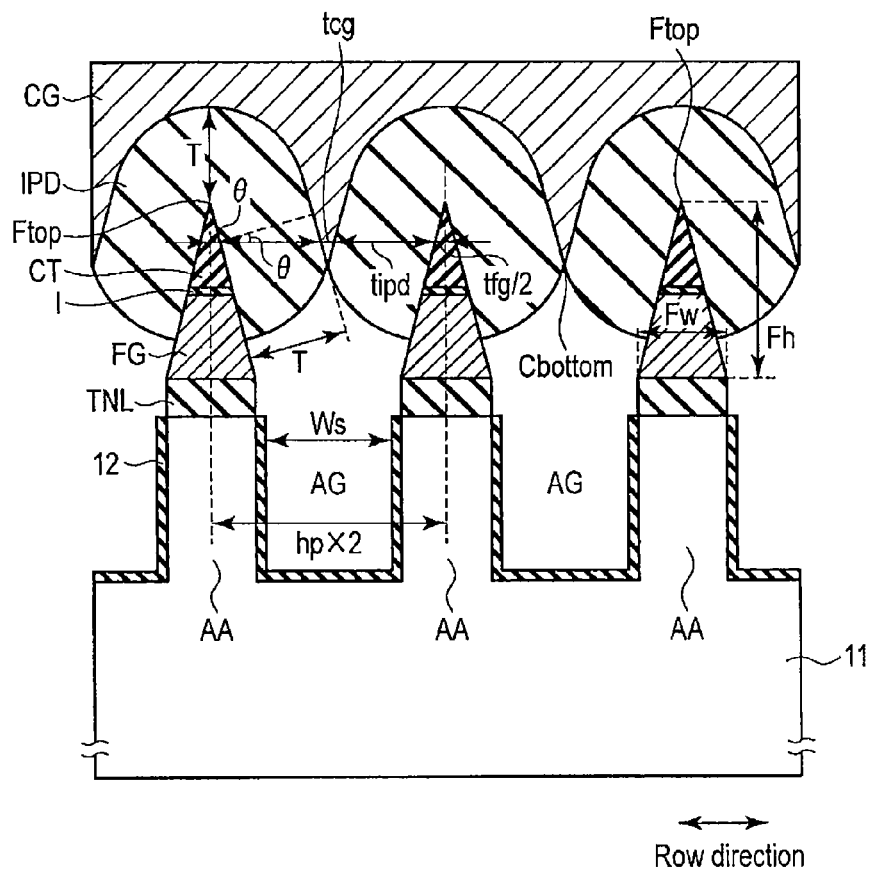
FIG. 21 is a sectional view showing an eleventh modification.

FIG. 21 shows a cell array structure according to the eleventh modification.

FIG. 21 corresponds to the sectional view (FIG. 2) in the row direction according to the first embodiment.

The present example is a further modification of the tenth modification. The cell array structure according to the present example is different from the tenth modification in that an entire charge trap layer CT and further a portion of a floating gate electrode FG are covered with an inter-electrode insulating layer IPD.

In other respects, the eleventh modification is the same as the tenth modification.

With the structure as described above, the same effect as the above hybrid type can be achieved.

[Twelfth Modification]

Figure 22:
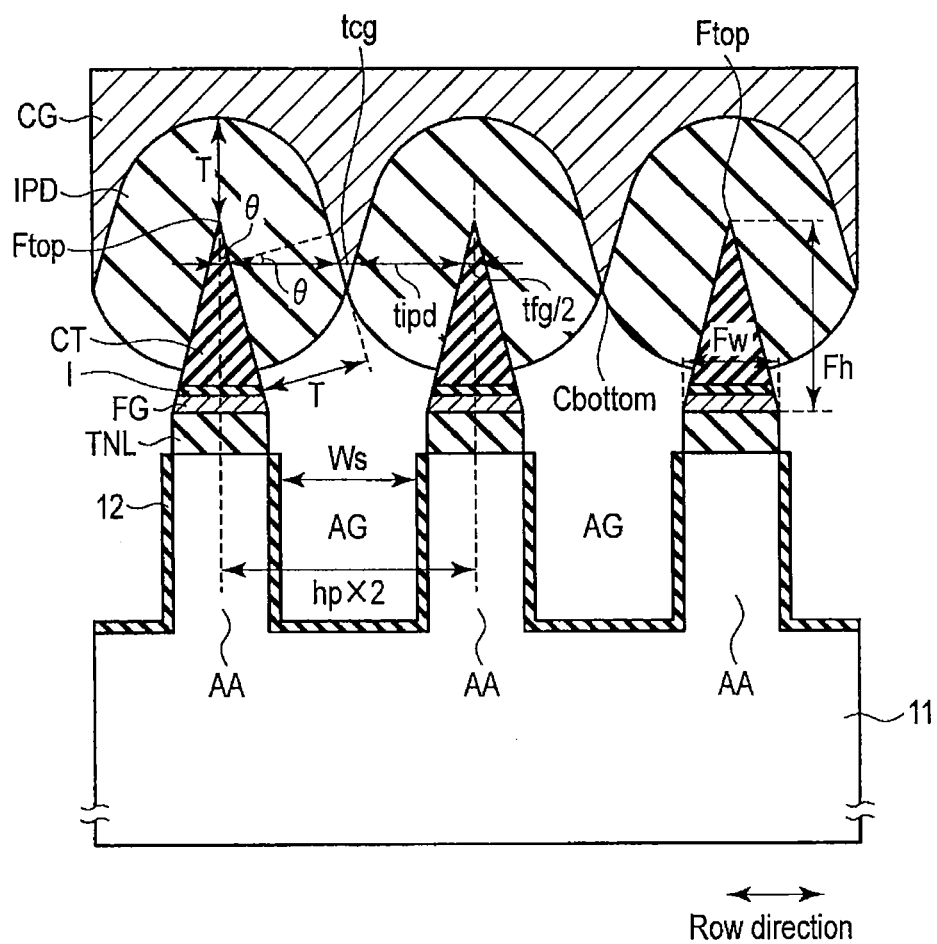
FIG. 22 is a sectional view showing a twelfth modification.

FIG. 22 shows a cell array structure according to the twelfth modification.

FIG. 22 corresponds to the sectional view (FIG. 2) in the row direction according to the first embodiment.

The present example is also a further modification of the tenth modification. The cell array structure according to the present example is different from the tenth modification in that a portion of a charge trap layer CT is covered with an inter-electrode insulating layer IPD.

In other respects, the twelfth modification is the same as the tenth modification.

With the structure as described above, the same effect as the above hybrid type can be achieved.

[Thirteenth Modification]

FIG. 23 shows a cell array structure according to the thirteenth modification.

FIG. 23 corresponds to the sectional view (FIG. 2) in the row direction according to the first embodiment.

The cell array structure according to the present example relates, like the tenth modification described above, to the hybrid type. The present example is characterized in that a charge trap layer CT is formed so as to cover a portion of the surface or the entire surface of a floating gate electrode FG.

For example, the floating gate electrode FG whose sectional shape in the row direction is triangular is arranged on a gate insulating layer (tunnel insulating layer) TNL. Further, an insulating layer (ultra-thin insulating layer) I of, for example, 10 nm or less in thickness is arranged so as to cover the entire surface of the floating gate electrode FG. The insulating layer may be omitted.

The charge trap layer CT is arranged on the surface of an upper portion of the floating gate electrode FG via the insulating layer I.

The floating gate electrode FG includes, as described above, a polysilicon layer, a metallic layer, or a lamination layer of these layers. The charge trap layer CT includes an insulating layer of SiN, SiON, $Al_2O_3$, HfO or the like.

The charge trap layer CT is completely covered with an inter-electrode insulating layer IPD, but a portion of the charge trap layer CT may be covered with the inter-electrode insulating layer IPD or a portion of the floating gate electrode FG may be covered with the inter-electrode insulating layer IPD.

According to the above structure, the charge storage layer of a memory cell includes the floating gate electrode FG and the charge trap layer CT. The charge trap layer CT has a function to raise a potential barrier by trapping charges and thus has an effect of preventing a leak current between two charge storage layers adjacent in the row or column direction.

The present example can realize an increase in coupling ratio and prevention of inter-cell interference at the same time.

[Fourteenth Modification]

FIG. 24 shows a cell array structure according to the fourteenth modification.

FIG. 24 corresponds to the sectional view (FIG. 2) in the row direction according to the first embodiment.

The present example is a further modification of the thirteenth modification. The cell array structure according to the present example is different from the thirteenth modification in that an entire charge trap layer CT and further a portion of a floating gate electrode FG are covered with an inter-electrode insulating layer IPD.

For example, a portion in an area between the floating gate electrode FG and the inter-electrode insulating layer IPD where the charge trap layer CT is not present is an air gap.

In other respects, the fourteenth modification is the same as the thirteenth modification.

With the structure as described above, the same effect as the above hybrid type can be achieved.

[Fifteenth Modification]

Figure 25:
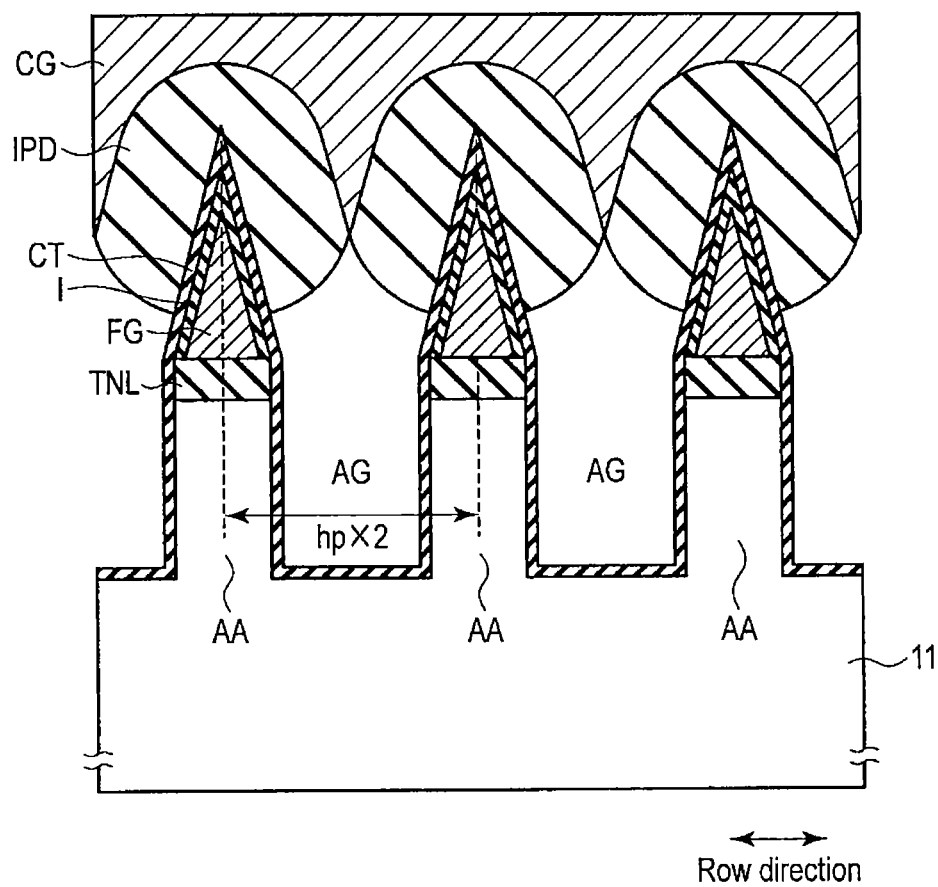
FIG. 25 is a sectional view showing a fifteenth modification.

FIG. 25 shows a cell array structure according to the fifteenth modification.

FIG. 25 corresponds to the sectional view (FIG. 2) in the row direction according to the first embodiment.

The present example is also a further modification of the thirteenth modification. The cell array structure according to the present example is different from the thirteenth modification in that a charge trap layer CT covers an entire floating gate electrode FG and further the surface of an active area AA.

Even if the charge trap layer CT covers the surface of the active area AA, a portion that actually traps charges is a portion adjacent to the floating gate electrode FG and thus, no problem is caused as memory cell characteristics.

In other respects, the fifteenth modification is the same as the thirteenth modification.

With the structure as described above, the same effect as the above hybrid type can be achieved.

In the above modifications excluding the third modification, the top portion of the floating gate electrode FG or the charge trap layer CT as a charge storage layer is acute, but may also be round. In such a case, leakage of information charges due to electric field concentration in an acute angle portion in the top portion can be reduced. An increase in coupling ratio and prevention of inter-cell interference can similarly be realized at the same time.

Summary

According to the first embodiment as described above, an increase in coupling ratio and prevention of inter-cell interference can be realized at the same time.

The air gap AG in all examples according to the first embodiment described above may be replaced by an insulating layer (for example, a silicon oxide layer) whose relative dielectric constant is smaller than that of the inter-electrode insulating layer IPD.

In each example of the first embodiment shown in FIGS. 1 to 19, the floating gate electrode FG may be replaced by the charge trap layer as an insulating layer that traps charges. That is, in these examples of the first embodiment, the charge storage layer of a memory cell may be a floating gate electrode or a charge trap layer.

Second Embodiment

Figure 26:
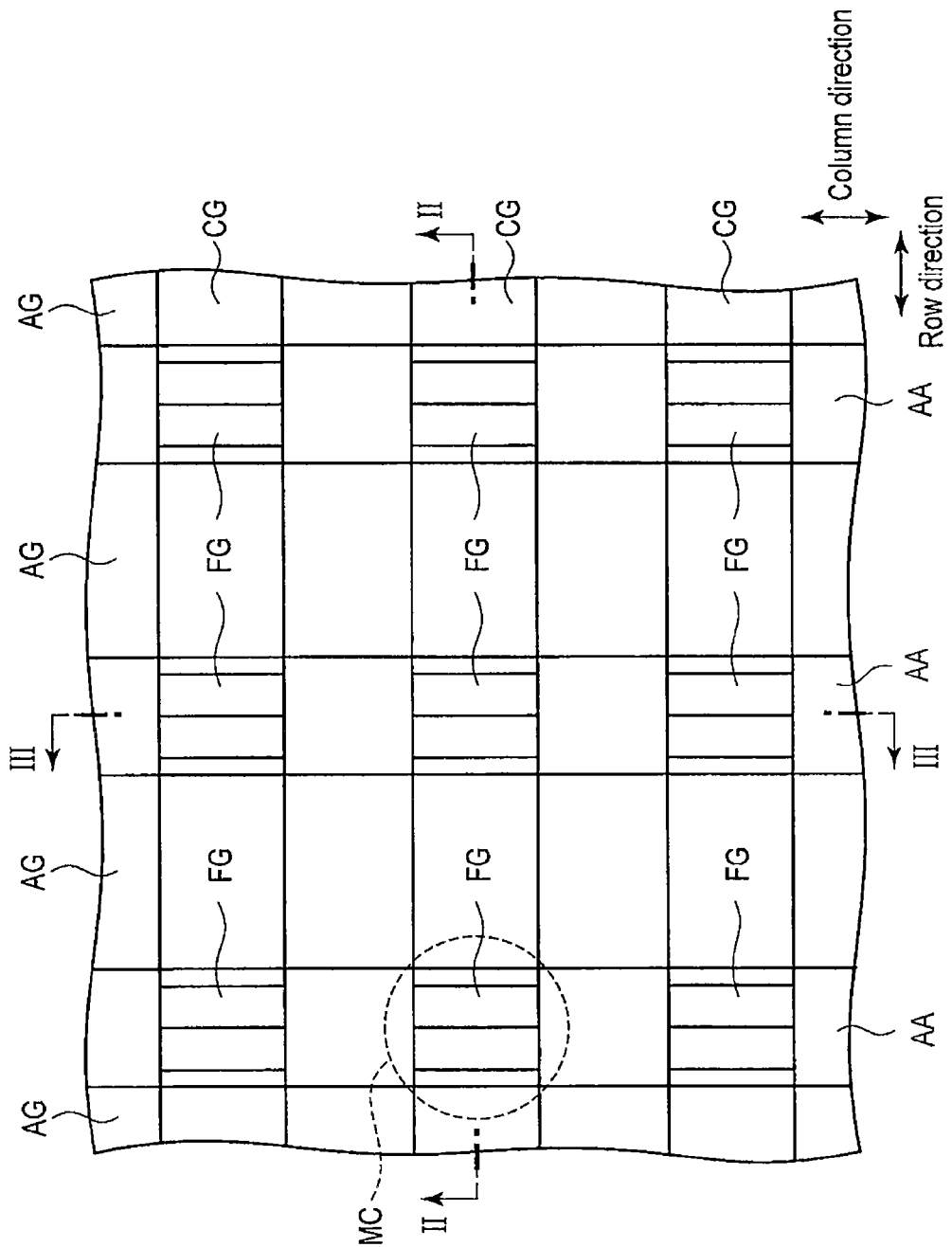
FIG. 26 is a plan view showing an array structure according to a second embodiment.
Figure 27:
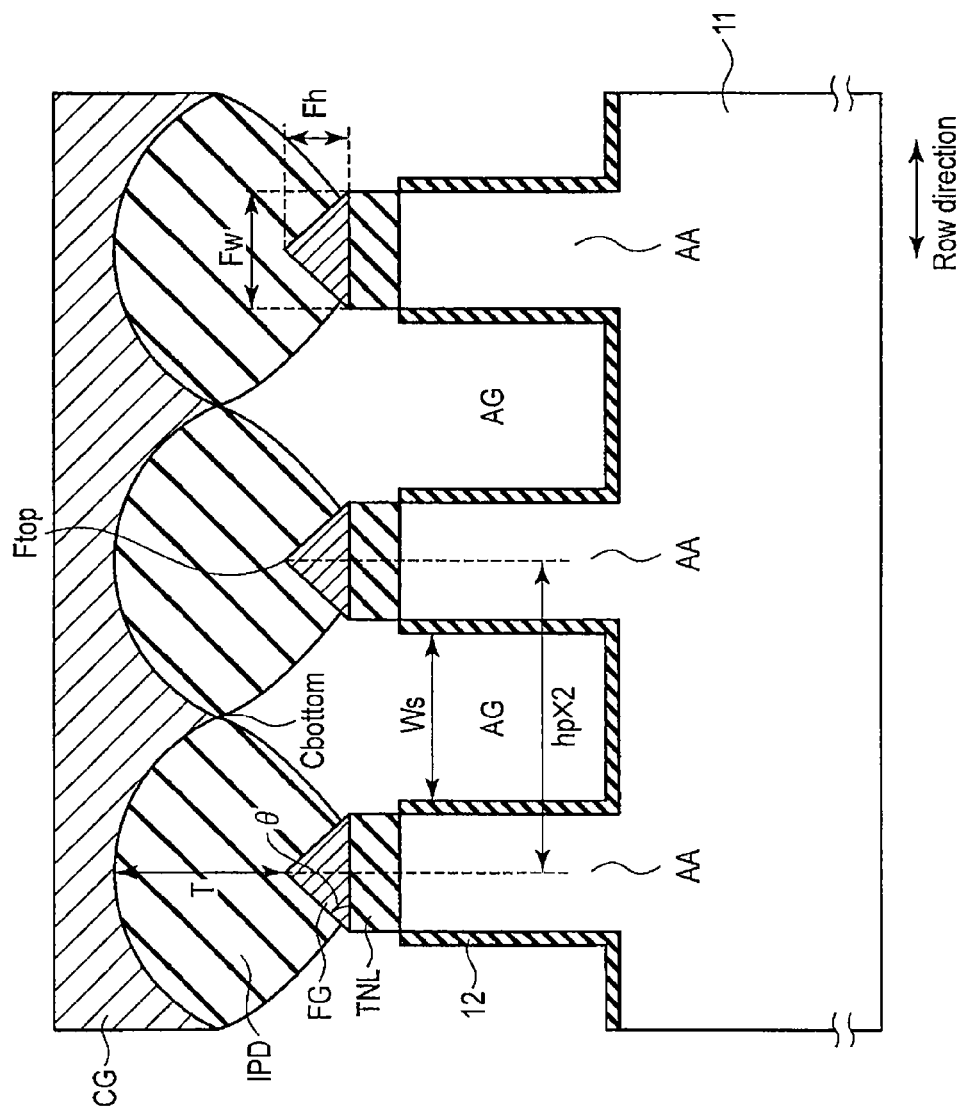
FIG. 27 is a sectional view along a II-II line in FIG. 26.

FIGS. 26 to 28 show an array structure.

FIG. 26 is a plan view of a memory cell array, FIG. 27 is a sectional view along a II-II line in FIG. 26, and FIG. 28 is a sectional view along a III-III line in FIG. 26.

Semiconductor substrate 11 is, for example, a silicon substrate. The upper surface of semiconductor substrate 11 has an irregular shape and projections form fin-type active areas AA. The fin-type active areas AA is aligned in the row direction (first direction) and also extend in the column direction (second direction) perpendicular to the row direction.

The upper surface (bottom of depressions) of semiconductor substrate 11 and the side face of the fin-type active areas AA may be covered with insulating layer 12. Insulating layer 12 is, for example, a layer of oxides formed by oxidizing semiconductor substrate 11. Insulating layer 12 prevents electrons in the fin-type active areas (channels) AA from escaping to an air gap AG.

In the present example, the fin-type active areas AA are a portion of semiconductor substrate 11, but are not limited to such an example. For example, the fin-type active areas AA may be a semiconductor layer such as an epitaxial layer on semiconductor substrate 11.

Memory cells (Field Effect Transistor: FET) MC are arranged on each fin-type active area AA. The memory cells MC on one fin-type active area AA constitutes a NAND string, for example, by being connected in series in the column direction.

Each memory cell MC includes a gate insulating layer (tunnel insulating layer) TNL on the fin-type active area AA, a floating gate electrode FG on the gate insulating layer TNL, an inter-electrode insulating layer IPD on the floating gate electrode FG, and a control gate electrode CG on the inter-electrode insulating layer IPD.

The gate insulating layer TNL is, for example, a silicon oxide layer and is formed by oxidizing the upper surface of the fin-type active area AA.

The floating gate electrode FG is, for example, a polysilicon layer, a metallic layer, or a lamination layer of these layers. The width of the floating gate electrode FG in the row direction gradually becomes narrower upward from below. In the present example, the floating gate electrode FG is a triangle of a base Fw and a height Fh, but the shape thereof is not limited to the above example. For example, the floating gate electrode FG may have a trapezoidal or semicircular shape.

However, the side face of the floating gate electrode FG present in the row direction is desirably plane or curved.

Figure 29:
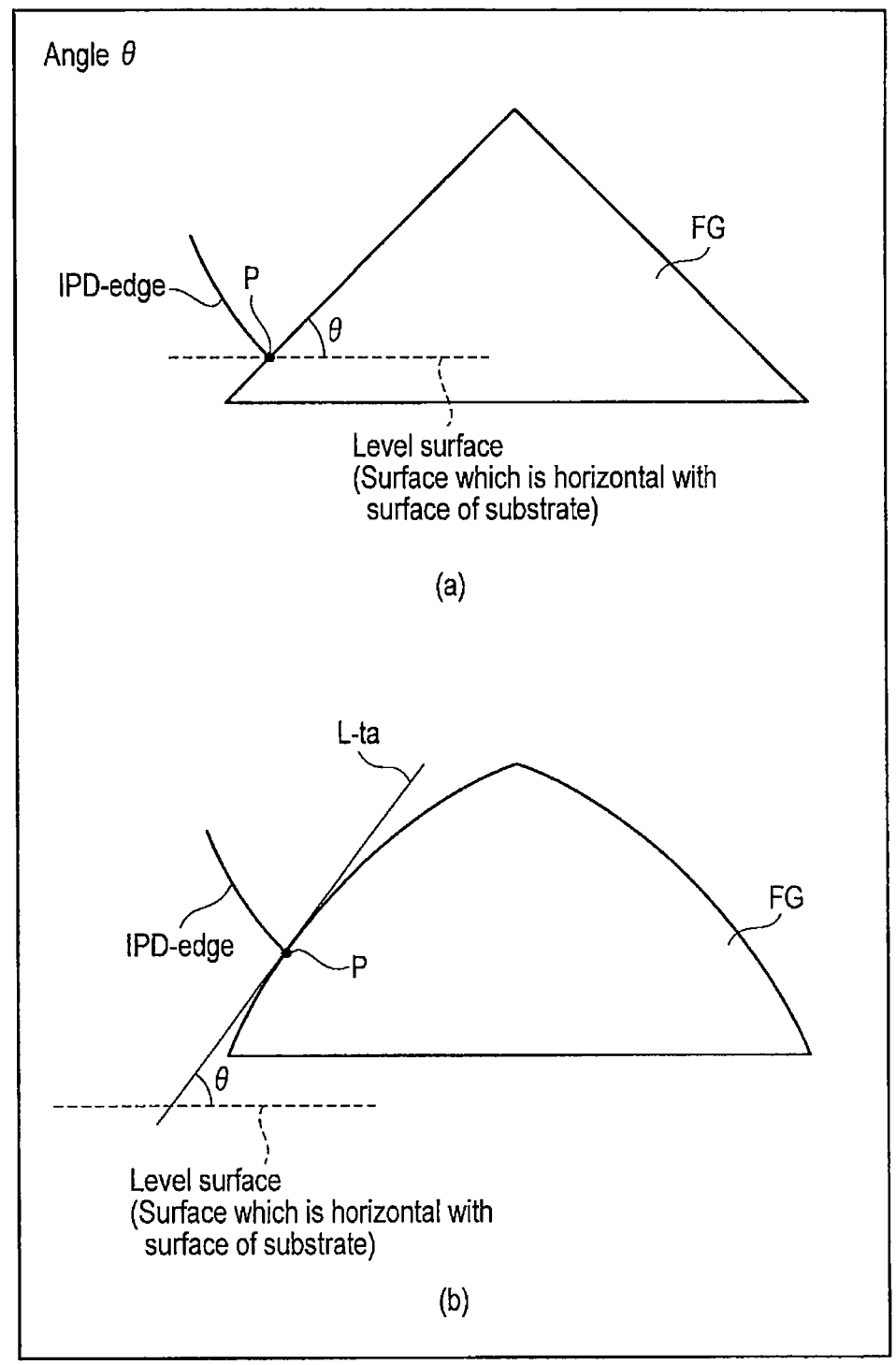
FIG. 29 is a diagram showing an angle $\theta$ that decides the shape of a charge storage layer.

In the present example, the shape of the floating gate electrode FG as described above by an angle θ. The angle θ is an angle formed by a tangent L-ta and a horizontal plane (upper surface of semiconductor substrate 11) at a contact point P of an edge IPD-edge of the inter-electrode insulating layer and the surface of the floating gate electrode FG as shown in FIG. 29.

The edge IPD-edge of the inter-electrode insulating layer is the lower surface of the inter-electrode insulating layer, more specifically, the lower surface of the inter-electrode insulating layer between fin-type active areas AA. In other words, if a memory cell is cut in an up and down direction by a line extending in the row direction, the edge IPD-edge refers to a portion of the lower surface of the inter-electrode insulating layer that is not in contact with the floating gate electrode FG. A point on the surface of the floating gate electrode FG where a line of the lower surface of the inter-electrode insulating layer touches is set as the contact point P.

If, for example, the floating gate electrode FG is designed to be an isosceles triangle, the angle θ is, as shown in FIG. 29A, means a low angle of the floating gate electrode FG. When a device is actually manufactured, even if the floating gate electrode FG is designed as an isosceles triangle, as shown in FIG. 29B, an oblique side extending from a vertex is frequently formed as a curved shape. In such a case, the definition of the above angle θ is very useful to determine the shape of the floating gate electrode FG.

In the present example, the angle θ is set to the range of 0°<θ≤45°. The reason therefor is as follows.

If the angle θ is, for example, as shown in FIG. 30A, a rocket type in the range of 45°<θ<90°, the opposing area of the floating gate electrode FG and the control gate electrode CG increase and so the coupling ratio of memory cells can be improved.

Moreover, by adopting a structure in which a lower edge portion of the floating gate electrode FG is not covered with the inter-electrode insulating layer IPD, inter-cell interference can be prevented. This effect is made more conspicuous by creating an air gap between lower edge portions of the two floating gate electrodes FG.

However, as is evident from FIG. 30A, the number of electric lines of force extending one floating gate electrode FG to other floating gate electrodes adjacent thereto increases with the increasing angle θ. This means an increase of inter-cell interference due to an increase of parasitic capacitance caused between the two floating gate electrodes FG.

Therefore, it is very important to estimate the optimal range of the angle θ to guide almost all electric lines of force extending from the floating gate electrode FG to the control gate electrode CG and to achieve improvement of the coupling ratio and prevention of inter-cell interference at the same time.

In the present example, as a result of simulation and verification using an actual device, as shown in FIG. 30B, the inventors found that many electric lines of force extending from the floating gate electrode FG can be guided to the control gate electrode CG by setting the angle θ to the range of 0°<θ≤45°.

If the floating gate electrode FG is a conductor, the surface thereof is always an equipotential surface and thus, an electric line of force always comes out from the surface of the floating gate electrode FG in a direction perpendicular to the surface thereof.

Therefore, if the angle θ is in the range of θ≤45°, an electric line of force on the surface of the floating gate electrode FG is less likely to move in the horizontal direction to the side of the adjacent floating gate electrodes FG and more likely to move in the vertical direction to the side of the control gate electrode CG.

As a result, by setting the angle θ to the range of θ≤45°, many electric lines of force extending from the floating gate electrode FG can be guided to the control gate electrode CG. If the floating gate electrode FG is not a perfect electric conductor, the floating gate electrode FG still has a similar tendency and in such a case, the angle θ is desirably in the range of θ≤45°.

The floating gate electrode FG has a tapering shape in which the width thereof becomes gradually narrower upward from below and thus, improvement of the coupling ratio due to an increased opposing area of the floating gate electrode FG and the control gate electrode CG can be realized.

Thus, improvement of the coupling ratio of memory cells and prevention of inter-cell interference can be realized at the same time by adopting the tapering shape for the floating gate electrode FG and setting the angle θ to the range of 0°≤θ≤45°.

The side face of the floating gate electrode FG present in the row direction may be covered with an insulating layer such as a layer of oxides. In such a case, the insulating layer covering the side face of the floating gate electrode FG present in the row direction prevents electrons stored in the floating gate electrode FG from escaping to an air gap AG.

The inter-electrode insulating layer IPD covers an upper portion of the floating gate electrode FG. A space between lower portions of the floating gate electrode FG is the air gap AG. By creating the air gap AG between lower portions, particularly between lower edge portions, the effect of preventing inter-cell interference can further be increased.

Figure 31:
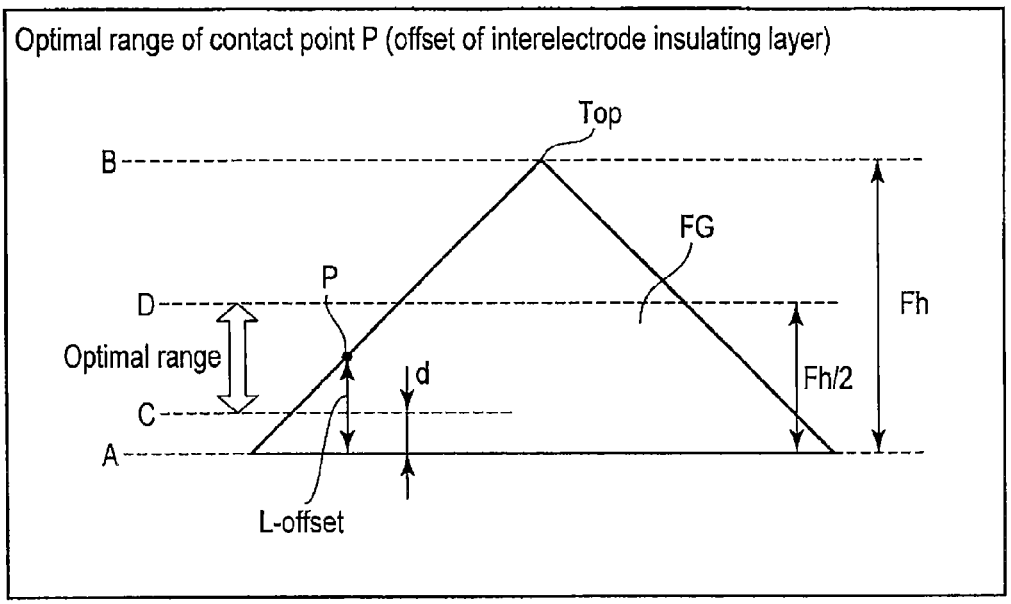
FIG. 31 is a diagram showing an optimal range of offset of the inter-electrode insulating layer.

If only a case when the lower edge portion of the floating gate electrode FG is not covered with the inter-electrode insulating layer IPD is considered, as shown in FIG. 31, the range of the contact point P can suitably be selected from a range of a lower surface (bottom) A (excluding the lower surface A) of the floating gate electrode FG to a surface B passing through a top Top of the floating gate electrode FG and parallel to the horizontal plane.

However, if the actual manufacturing process and improvement of the coupling ratio are considered, the range of the contact point P is further limited.

Thus, an offset of the inter-electrode insulating layer IPD is as an index that the lower edge portion of the floating gate electrode FG is not covered with the inter-electrode insulating layer IPD. The offset of the inter-electrode insulating layer IPD is, as shown in FIG. 31, is the shortest distance L-offset from the lower surface (bottom) A of the floating gate electrode FG to the contact point P.

If the offset L-offset of the inter-electrode insulating layer IPD is too small, an increase of inter-cell interference is invited and conversely, if the offset L-offset is too large, a decrease of the coupling ratio of memory cells is invited and thus, the optimal range satisfying both at the same time exists.

In the present example, as a result of simulation and verification using an actual device, as shown in FIG. 31, the inventors found that the optimal range of the contact point P (offset of the inter-electrode insulating layer) is a surface C positioned a width d above the lower surface (bottom) A of the floating gate electrode FG or above, and a surface D passing through half a height Fh (Fh/2) of the floating gate electrode FG or below.

To ensure the coupling ratio, for example, the angle θ is expected to be designed at 45°. In such a case, if the contact point P is at (Fh/2), a covered surface area of the floating gate electrode FG by the inter-electrode insulating layer will be (bottom area of the floating gate electrode)×$2^{1/2}$/2=(bottom area of the floating gate electrode)×0.7.

The covered surface area refers to the surface of the floating gate electrode FG in the row direction.

In contrast, the area of the control gate electrode CG opposed to the floating gate electrode PG is given by (bottom area of the floating gate electrode)×1.4 if the height Fh of the floating gate electrode FG is about 10 nm and the physical film thickness of the inter-electrode insulating layer is about 10 nm. This is about twice the covered surface area of the floating gate electrode FG by the inter-electrode insulating layer.

From the above, if the contact point P is set to (Fh/2), the average value of the opposing area between the floating gate electrode FG and the control gate electrode CG via the inter-electrode insulating layer is given by (bottom area of the floating gate electrode)×[(0.7+1.4)/2], which is approximately equal to the bottom area of the floating gate electrode FG.

Being equal to the bottom area of the floating gate electrode FG means being equal to the opposing area (bottom area of the floating gate electrode) between the floating gate electrode FG and the control gate electrode CG in the floating gate electrode FG (quadrangular shape) in the flat cell structure.

Therefore, according to the second embodiment, it is clear that a larger effective area (opposing area between the floating gate electrode FG and the control gate electrode CG) than the effective area of the flat cell structure can be realized by setting the contact point P lower than (Fh/2).

The width d is about 1 nm. That is, if the height Fh of the floating gate electrode FG is assumed to be 10 nm, the optimal range of the contact point P will be the range of 1 nm or more and 5 nm or less from the lower surface A of the floating gate electrode FG.

The offset L-offset needs the lower limit d=1 nm because electric lines of force moving toward the adjacent floating gate electrodes FG are concentrated in acute angle portions on both ends at the bottom of the floating gate electrode FG. That is, if acute angle portions on both ends at the bottom of the floating gate electrode FG should be covered with an inter-electrode insulating layer having a high dielectric constant, this is contrary to the original purpose of moving many electric lines of force toward the control gate electrode CG.

Moreover, the height Fh of the floating gate electrode FG is assumed to be 10 nm or less and thus, if the offset of d=1 nm, which is 10% of the maximum value (10 nm) of the height Fh, or more is secured, acute angle portions on both ends at the bottom of the floating gate electrode FG can reliably be prevented from being covered with the inter-electrode insulating layer so that almost all electric lines of force coming out from the surface of the floating gate electrode FG can be guided to the control gate electrode CG.

Therefore, the coupling ratio can be secured and at the same time, inter-cell interference can be prevented.

To improve the coupling ratio of memory cells, the inter-electrode insulating layer IPD includes, for example, a high dielectric constant material having a higher dielectric constant than a silicon oxide layer. The high dielectric constant material is, for example, a metallic oxide such as $Al_2O_3$, $ZrO_2$, $HfO_2$, HfSiO, HfAlO, LaAlO(LAO), and LaAlSiO (LASO) or a laminated structure of these. The high dielectric constant material may also be a laminated structure of a silicon oxide layer and a silicon nitride layer like ONO.

If the floating gate electrode FG and the control gate electrode CG contain a polysilicon layer, the inter-electrode insulating layer IPD may also be called an inter-polysilicon dielectric (IPD).

The control gate electrode CG includes a polysilicon layer, a metallic silicide layer, or a laminated structure of these. The control gate electrode CG and the inter-electrode insulating layer IPD extend in the row direction. The control gate electrode CG constitutes a word line.

In the above array structure, the two inter-electrode insulating layers IPD of two memory cells adjacent in the row direction share a contact portion through which both are in contact with each other.

The thickness (zero or almost zero in the present example) of the two inter-electrode insulating layers IPD in the contact portion in a vertical direction (third direction) perpendicular to the row direction and the column direction is smaller than a thickness T of the two inter-electrode insulating layers IPD in the vertical direction in top portions Ftop of the two floating gate electrodes FG of two memory cells adjacent in the row direction.

Accordingly, the control gate electrode CG has a bottom portion Cbottom in the contact portion of the two inter-electrode insulating layers IPD. The bottom portion Cbottom of the control gate electrode CG is above the top portion Ftop of the floating gate electrode FG.

A half pitch hp corresponds to half the pitch of a bit line (not shown) arranged in the upper portion of the active area AA.

In the present example, an air gap is formed between the floating gate electrodes FG, but can be replaced by an insulating layer (for example, a silicon oxide layer) having a relative dielectric constant smaller than that of the inter-electrode insulating layer IPD. In addition, the charge storage layer of the memory cells MC is the floating gate electrode FG in the present example, but the floating gate electrode FG can also be replaced by a charge trap layer (insulating layer) having a function to trap charges.

In the present example, the memory cells MC aligned in the column direction do not have a diffusion layer in the fin-type active area AA. This is because if each memory cell MC is made finer, a channel can be formed in the fin-type active area AA due to the so-called fringe effect without the diffusion layer.

However, each memory cell MC may have a diffusion layer in the fin-type active area AA.

According to an array structure in the present example, an increase in coupling ratio and prevention of inter-cell interference can be realized in the flat cell structure at the same time.

[Manufacturing Method]

The method of manufacturing a cell array structure according to the second embodiment will be described.

Figure 32:
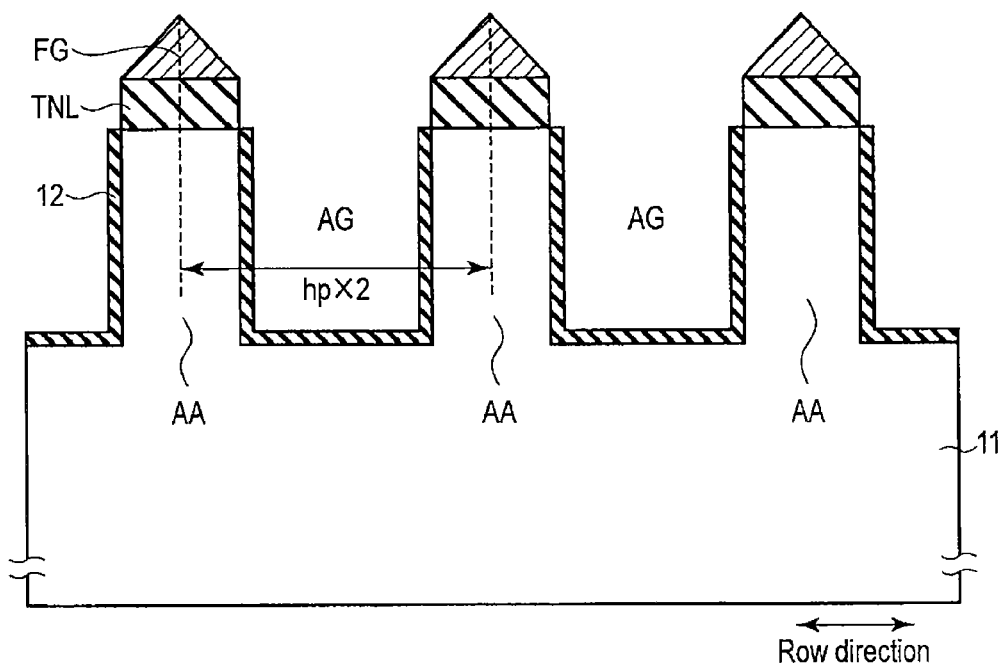

First, as shown in FIG. 32, the gate insulating layer TNL and the floating gate electrode FG are formed on semiconductor substrate 11. The gate insulating layer TNL is, for example, a silicon oxide layer and the floating gate electrode FG is, for example, a polysilicon layer.

Then, a photoresist layer is formed on the floating gate electrode FG by PEP (Photo Engraving Process). The photoresist layer has a line & space pattern aligned with a fixed pitch in the row direction and extending in the column direction.

Then, the floating gate electrode FG is patterned by RIE (Reactive Ion Etching) using the photoresist layer as a mask. The photoresist layer is removed and subsequently, the gate insulating layer TNL and semiconductor substrate 11 are etched by dry etching using the floating gate electrode FG as a mask.

As a result, the active area AA having a line & space pattern aligned with a fixed pitch (2× half pitch hp) in the row direction and extending in the column direction is formed. At the same time, the floating gate electrode FG is partially etched to form the floating gate electrode FG in a tapering shape upward from below.

Then, the surface of semiconductor substrate 11 is covered with insulating layer 12. Insulating layer 12 may be a natural oxidation layer. The surface of the floating gate electrode FG may also be covered with an insulating layer such as a natural oxidation layer.

In place of the above process, the floating gate electrode FG, the gate insulating layer TNL, and semiconductor substrate 11 may successively be etched by RIE using the photoresist layer as a mask. In this case, after the etching, etching to form the floating gate electrode FG into a tapering shape is performed.

Next, as shown in FIG. 33, insulating layer (for example, a silicon oxide layer) 13 with poor coverage is formed only on an upper portion of the floating gate electrode FG by the sputter process or CVD method. Subsequently, as shown in FIG. 34, insulating layer (for example, a lanthanum aluminate layer) 14 with poor coverage is formed only on insulating layer 13 on the upper portion of the floating gate electrode FG by the sputter process or CVD method.

Figure 35:
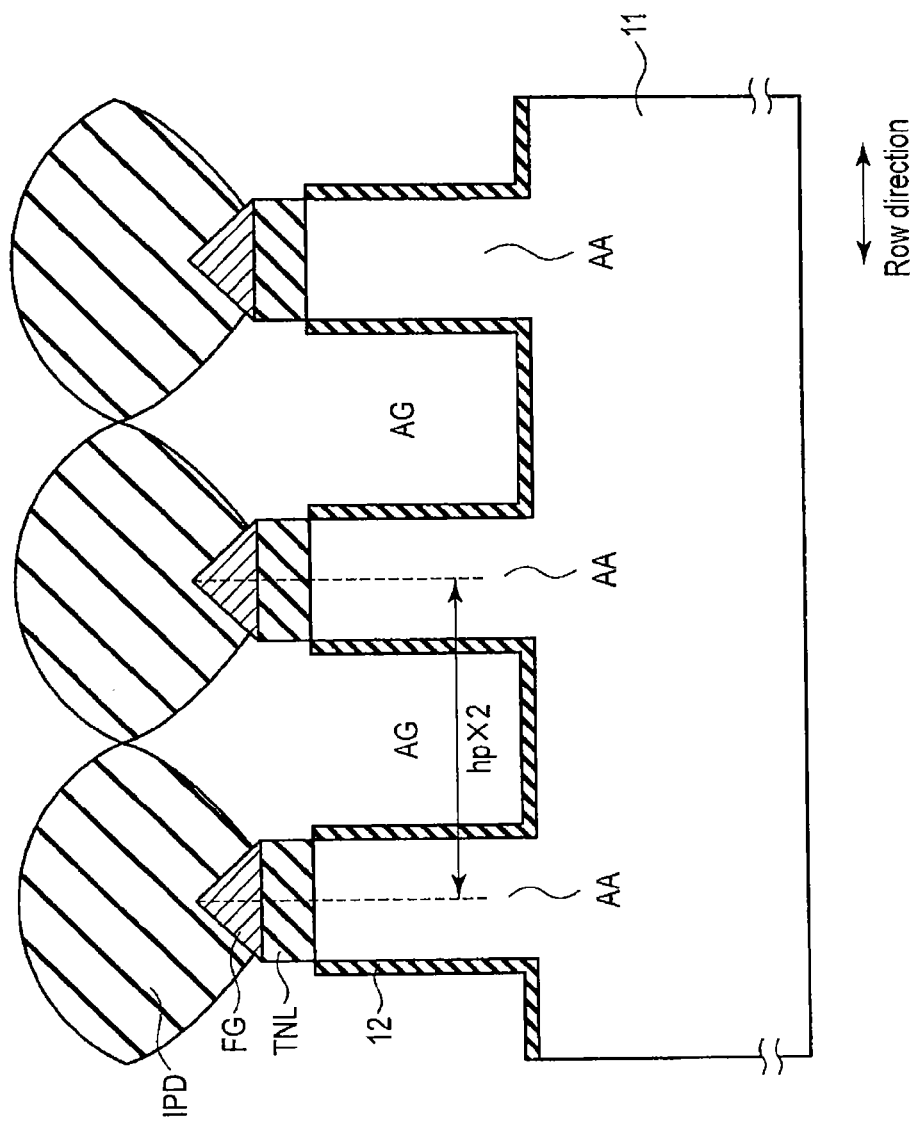

Then, two insulating layers 13, 14 are made to react by, for example, heat treatment to form, as shown in FIG. 35, one insulating layer (for example, a lanthanum aluminosilicate layer) as the inter-electrode insulating layer IPD.

Lastly, as shown in FIG. 36, the control gate electrode CG is formed on the inter-electrode insulating layer IPD. The control gate electrode CG is formed by, for example, the following process.

An electrode material is formed on the inter-electrode insulating layer IPD and a mask layer is formed on the electrode material. The mask layer has a line & space pattern aligned with a fixed pitch in the column direction and extending in the row direction.

Then, each of the electrode material and the inter-electrode insulating layer IPD is patterned by RIE using the mask layer as a mask. At this point, the floating gate electrode FG present in a region that is not covered with the mask layer is also etched.

That is, the floating gate electrodes FG of memory cells connected in series in the column direction are isolated from each other.

The mask layer is, for example, a hard mask layer to perform a sidewall patterning process (double patterning process). The process is known as a technology to realize a narrow line width or a narrow line pitch.

With the above manufacturing method, the cell array structure according to the second embodiment is completed.

[First Modification]

Figure 37:
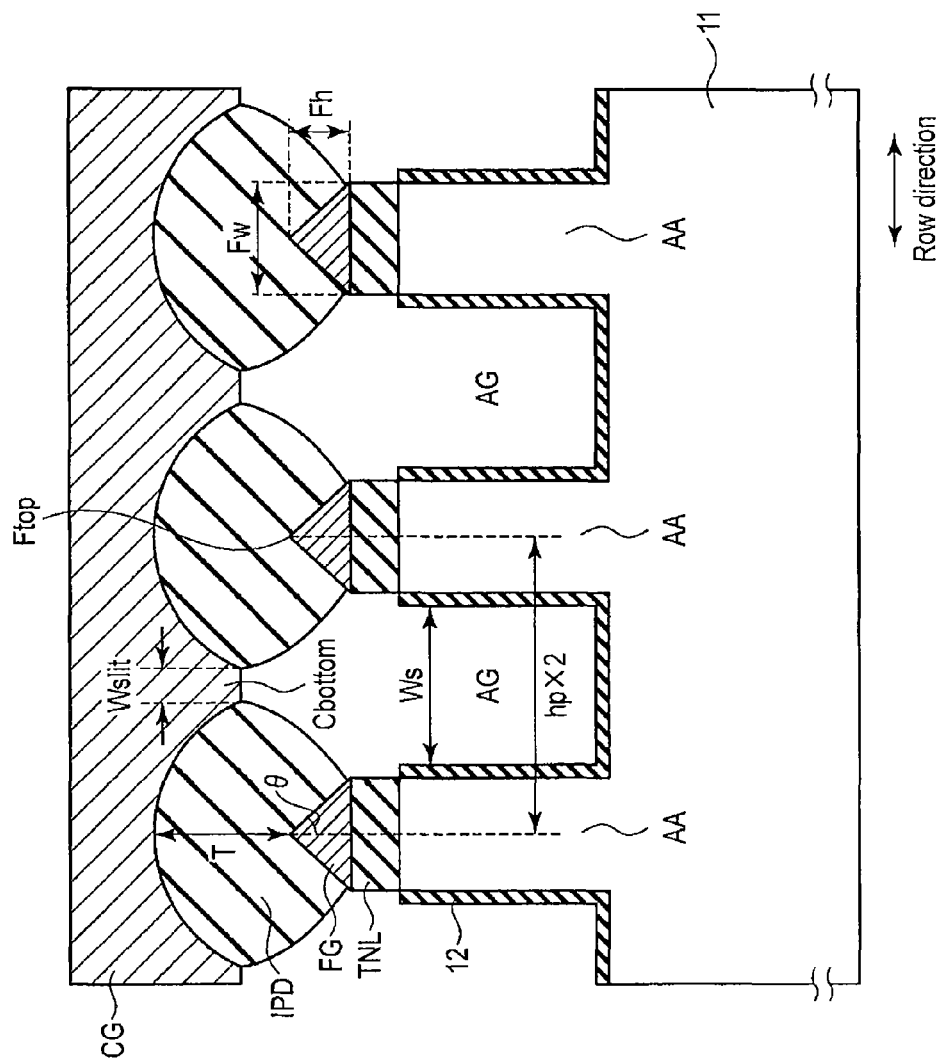
FIG. 37 is a sectional view showing a first modification.

FIG. 37 shows a cell array structure according to the first modification.

FIG. 37 corresponds to the sectional view (FIG. 27) in the row direction according to the second embodiment.

The cell array structure according to the present example is different from the cell array structure according to the second embodiment in that with an opening formed between two inter-electrode insulating layers IPD of two memory cells adjacent in the row direction, these inter-electrode insulating layers IPD are isolated from each other.

The width in the row direction of the opening between the two inter-electrode insulating layers IPD of two memory cells adjacent in the row direction is Wsilt.

The width Wsilt is desirably narrower than a width Ws in the row direction of two active areas AA adjacent in the row direction.

According to the present example, the effect of an increase in coupling ratio and prevention of inter-cell interference can further be improved.

[Second Modification]

Figure 38:
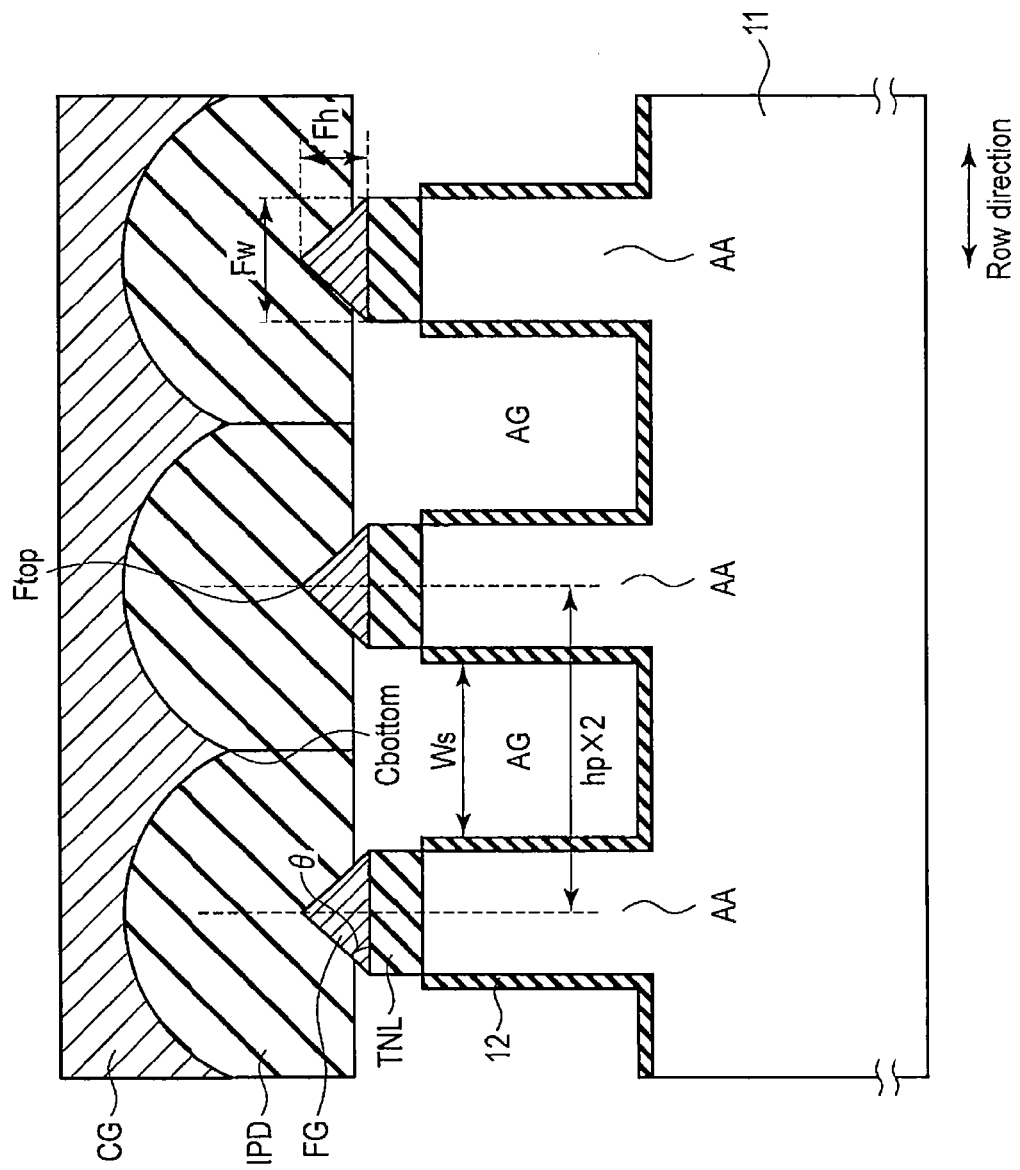
FIG. 38 is a sectional view showing a second modification.

FIG. 38 shows a cell array structure according to the second modification.

FIG. 38 corresponds to the sectional view (FIG. 27) in the row direction according to the second embodiment.

The cell array structure according to the present example is different from the cell array structure according to the second embodiment in that the bottom of two inter-electrode insulating layers IPD of two memory cells adjacent in the row direction is flat.

This structure results from the manufacturing method.

When the inter-electrode insulating layer IPD is formed from an insulating layer with poor coverage, a structure according to the second embodiment or the first modification can be obtained. In this case, however, a portion of the material constituting the inter-electrode insulating layer IPD may be deposited inside an air gap AG between active areas AA.

Thus, a structure according to the present example may be obtained by forming the inter-electrode insulating layer IPD while the air gap AG between active areas AA is filled with a dummy insulating layer and then selectively removing the dummy insulating layer.

According to the manufacturing method, the bottom of the two inter-electrode insulating layers IPD of two memory cells adjacent in the row direction becomes flat.

A concrete manufacturing method will be described below.

Figure 39:
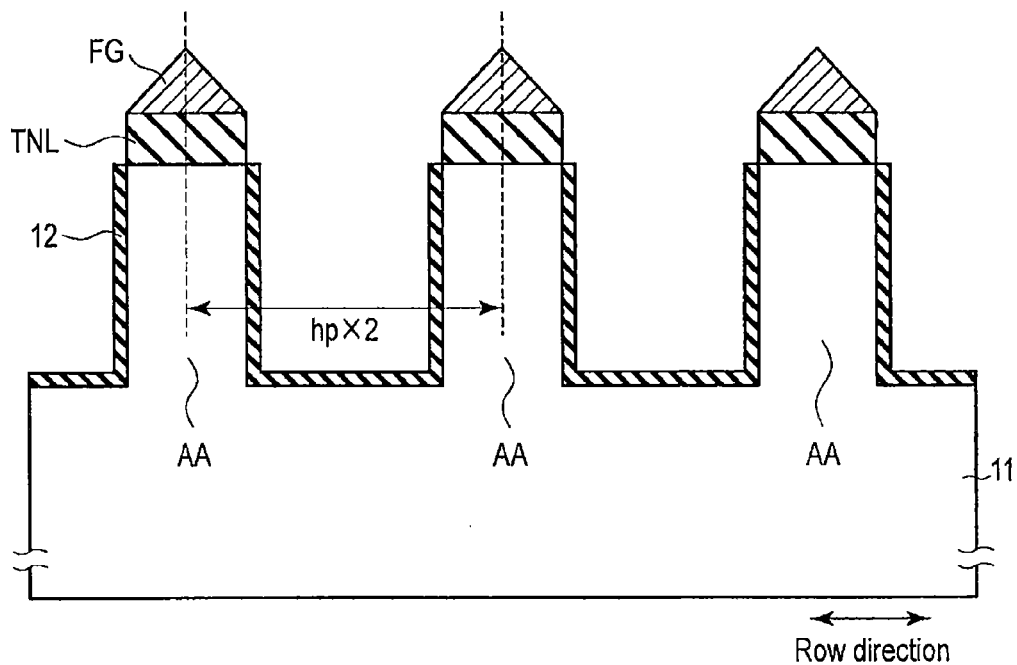
FIGS. 39 to 42 are sectional views showing a manufacturing method.

First, as shown in FIG. 39, the gate insulating layer TNL and the floating gate electrode FG are formed on semiconductor substrate 11. The gate insulating layer TNL is, for example, a silicon oxide layer and the floating gate electrode FG is, for example, a polysilicon layer.

Then, a photoresist layer is formed on the floating gate electrode FG by PEP. The photoresist layer has a line & space pattern aligned with a fixed pitch in the row direction and extending in the column direction.

Then, the floating gate electrode FG is patterned by RIE using the photoresist layer as a mask. The photoresist layer is removed and subsequently, the gate insulating layer TNL and semiconductor substrate 11 are etched by dry etching using the floating gate electrode FG as a mask.

As a result, the active area AA having a line & space pattern aligned with a fixed pitch (2× half pitch hp) in the row direction and extending in the column direction is formed. At the same time, the floating gate electrode FG is partially etched to form the floating gate electrode FG in a tapering shape upward from below.

Then, the surface of semiconductor substrate 11 is covered with insulating layer 12. Insulating layer 12 may be a natural oxidation layer. The surface of the floating gate electrode FG may also be covered with an insulating layer such as a natural oxidation layer.

In place of the above process, the floating gate electrode FG, the gate insulating layer TNL, and semiconductor substrate 11 may successively be etched by RIE using the photoresist layer as a mask. In this case, after the etching, etching to form the floating gate electrode FG into a tapering shape is performed.

Figure 40:
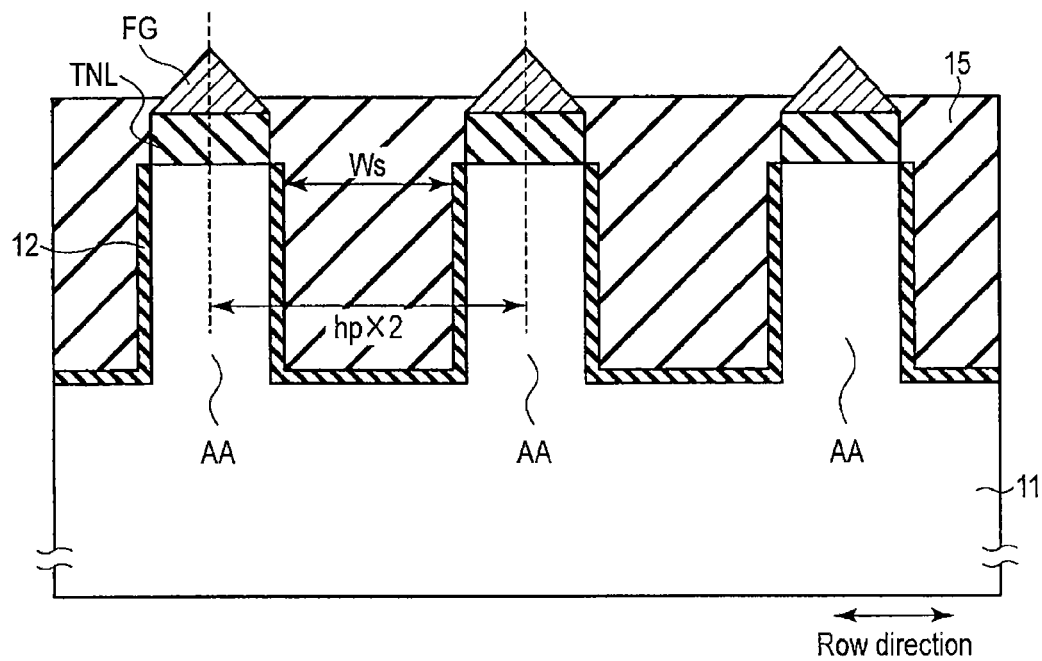

Next, as shown in FIG. 40, the air gap AG between active areas AA is filled with dummy insulating layer 15. The upper surface of dummy insulating layer 15 is above the bottom of the floating gate electrode FG. That is, the lower edge portion of the floating gate electrode FG is covered with dummy insulating layer 15.

Figure 41:
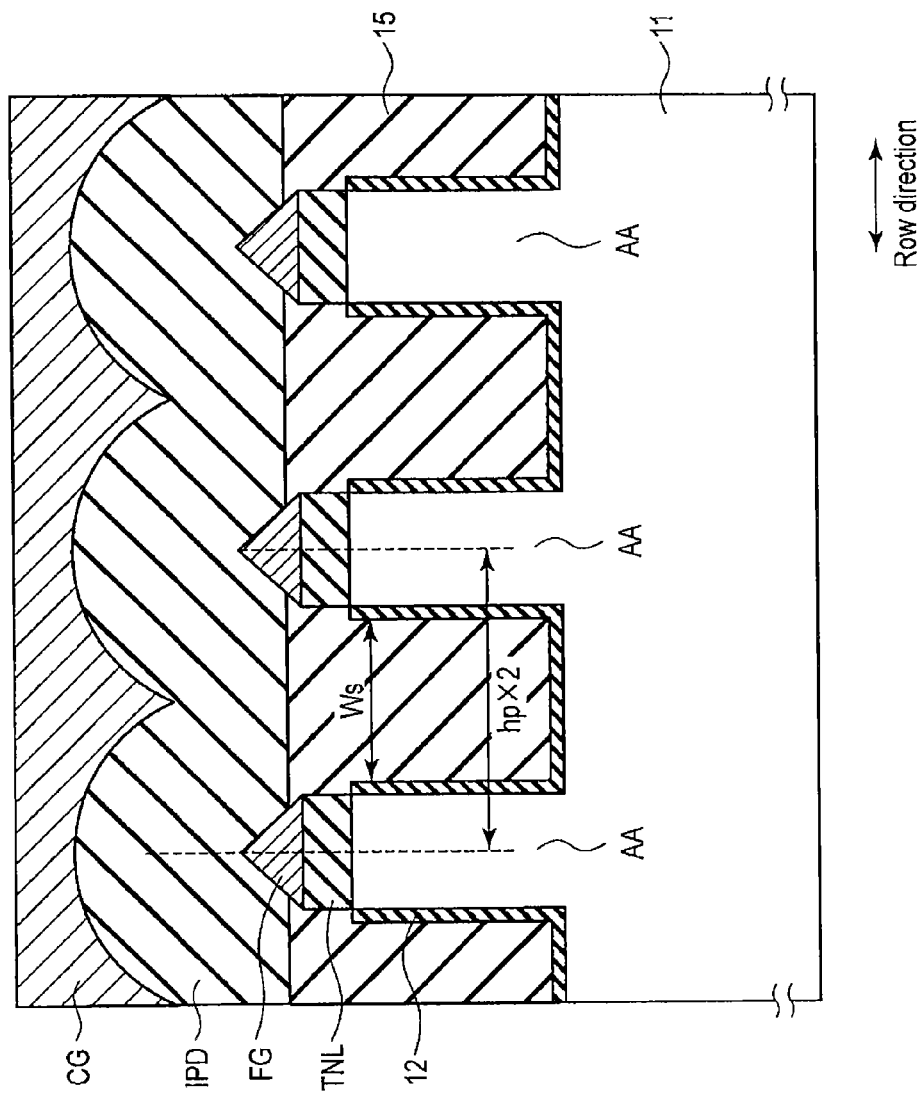

Next, as shown in FIG. 41, the inter-electrode insulating layer (for example, a lanthanum aluminosilicate layer) IPD is formed on each of the floating gate electrode FG and dummy insulating layer 15 by the sputter process or CVD method.

Subsequently, the control gate electrode CG is formed on the inter-electrode insulating layer IPD. Then, a mask layer is formed on the control gate electrode CG. The mask layer has a line & space pattern aligned with a fixed pitch in the column direction and extending in the row direction.

Then, each of the control gate electrode CG and the inter-electrode insulating layer IPD is patterned by RIE using the mask layer as a mask. At this point, the floating gate electrode FG present in a region that is not covered with the mask layer is also etched.

That is, the floating gate electrodes FG of memory cells connected in series in the column direction are isolated from each other.

The mask layer is, for example, a hard mask layer to perform a sidewall patterning process (double patterning process). The process is known as a technology to realize a narrow line width or a narrow line pitch.

Figure 42:
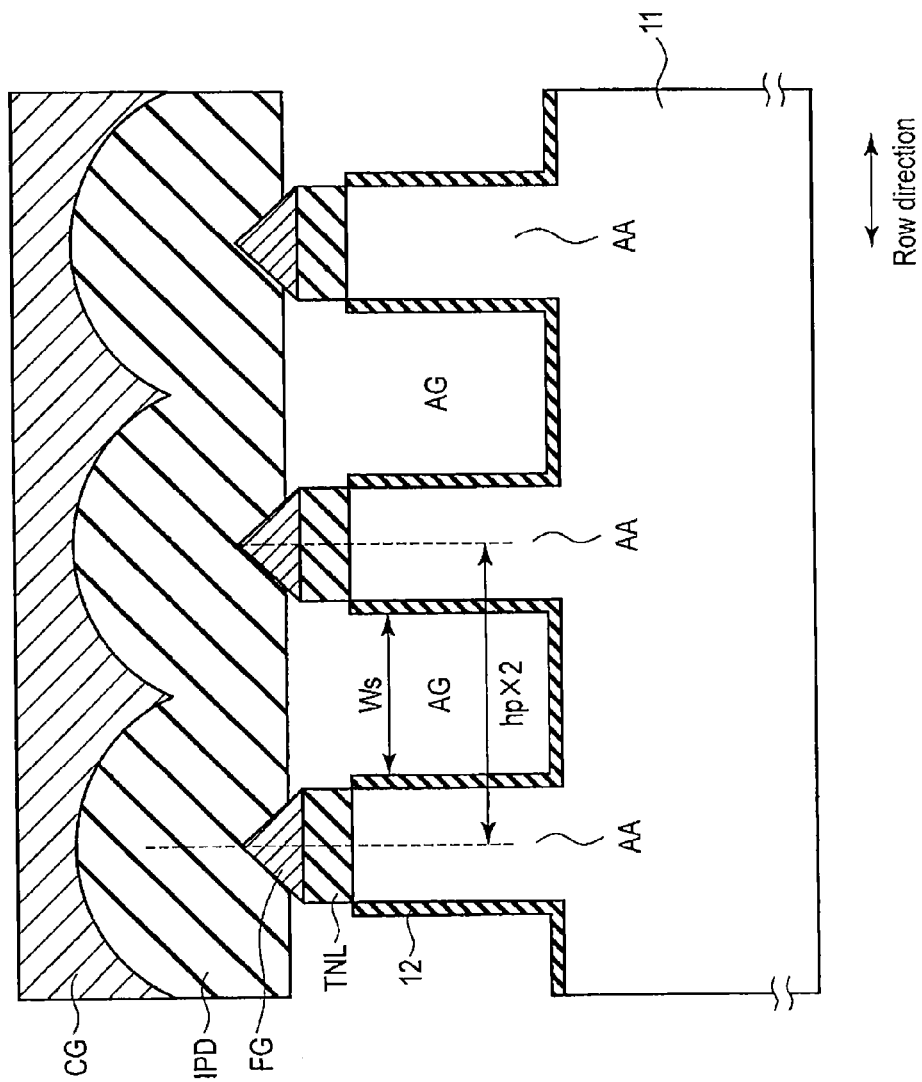

Lastly, as shown in FIG. 42, dummy insulating layer 15 in FIG. 41 is selectively removed from a space between the control gate electrode CG and the inter-electrode insulating layer IPD processed as a line & space pattern by, for example, wet etching using a dilute fluoric acid solution As a result, the air gap AG is formed between active areas AA.

With the above manufacturing method, the cell array structure according to the second modification is completed.

[Third Modification]

Figure 43:
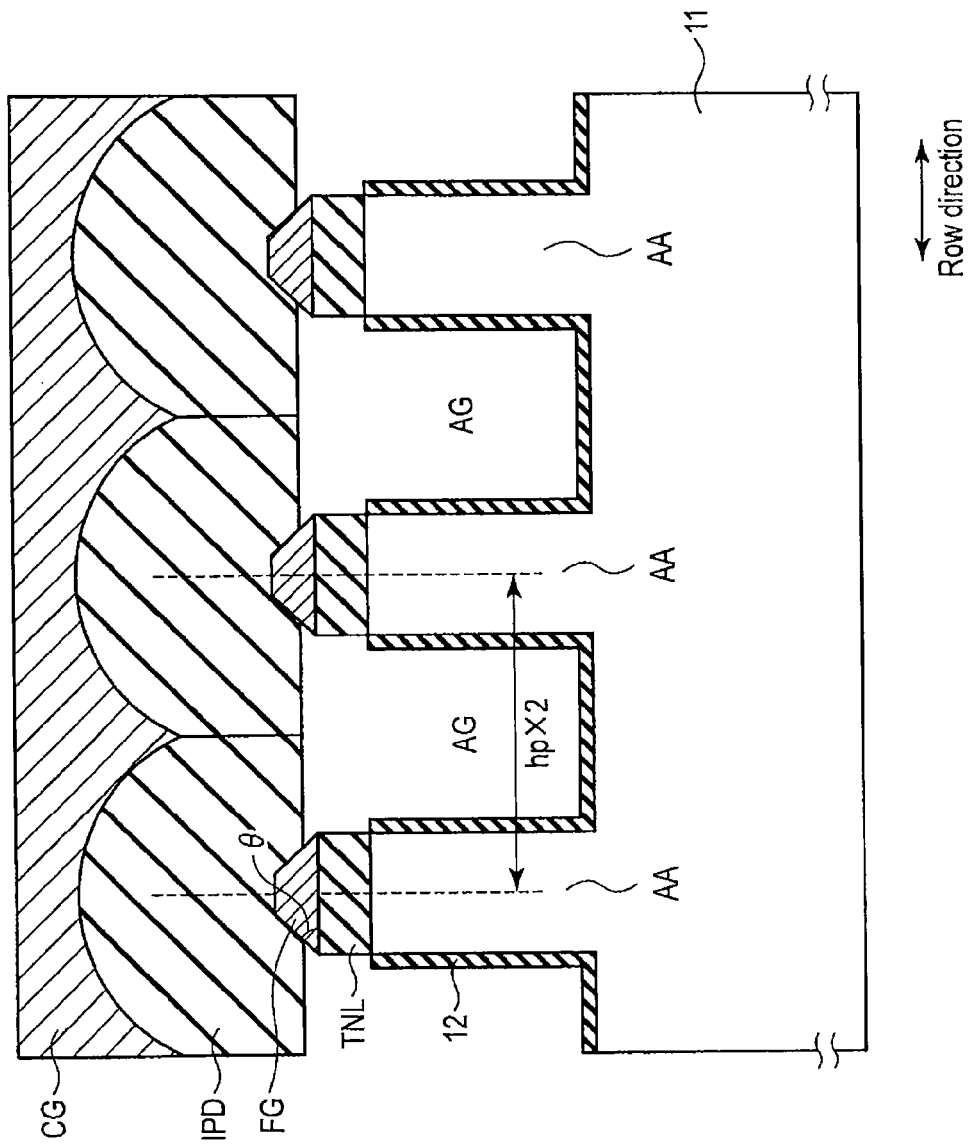
FIG. 43 is a sectional view showing a third modification.

FIG. 43 shows a cell array structure according to the third modification.

FIG. 43 corresponds to the sectional view (FIG. 27) in the row direction according to the second embodiment.

The present example is a further modification of the second modification. The cell array structure according to the present example is different from the cell array structure according to the second modification in that a top portion of a floating gate electrode FG is flat.

That is, the section of the floating gate electrode FG in the row direction is trapezoidal. Moreover, as described above, if the floating gate electrode FG is designed to be trapezoidal, each side of the trapezoid may be curved in an actual device, resulting in a shape close to a semicircular shape.

Even in such a case, if conditions of the shape (angle θ) of the floating gate electrode FG and the offset of the inter-electrode insulating layer described in the second embodiment are met, an increase in coupling ratio and prevention of inter-cell interference can be realized in the flat cell structure at the same time.

[Fourth Modification]

FIG. 44 shows a cell array structure according to the fourth modification.

FIG. 44 corresponds to the sectional view (FIG. 27) in the row direction according to the second embodiment.

The present example is also a further modification of the second modification. The cell array structure according to the present example is different from the cell array structure according to the second modification in that a floating gate electrode FG has a multilayer structure.

That is, the floating gate electrode FG includes a first conductive layer FG1 on a gate insulating layer TNL and a second conductive layer FG2 on the first conductive layer FG1.

The first conductive layer FG1 is, for example, a polysilicon layer. The second conductive layer FG2 is, for example, a titanium layer, tungsten layer, or tantalum layer. The first and second conductive layers FG1, FG2 are not limited to the above materials, but have mutually different materials.

Mutually different materials include a case when the first conductive layer FG1 contains a portion or all of compositions of the second conductive layer FG2.

The above case is, for example, a case when the second conductive layer FG2 is a titanium layer, tungsten layer, or tantalum layer and the first conductive layer FG1 is a titanium silicide layer, tungsten silicide layer, or tantalum silicide layer.

Also according to the present example, an increase in coupling ratio and prevention of inter-cell interference can be realized in the flat cell structure at the same time.

[Fifth Modification]

FIG. 45 shows a cell array structure according to the fifth modification.

FIG. 45 corresponds to the sectional view (FIG. 27) in the row direction according to the second embodiment.

The present example is also a further modification of the second modification. The cell array structure according to the present example is different from the cell array structure according to the second modification in that the side face in a lower portion of the floating gate electrode FG in the row direction is not inclined (tapered) and is almost perpendicular to the upper surface of semiconductor substrate 11.

Whether the shape of the floating gate electrode FG is like in the second embodiment or the present example depends on the materials constituting the floating gate electrode FG and conditions for patterning the floating gate electrode FG.

Also according to the present example, an increase in coupling ratio and prevention of inter-cell interference can be realized in the flat cell structure at the same time.

[Sixth Modification]

Figure 46:
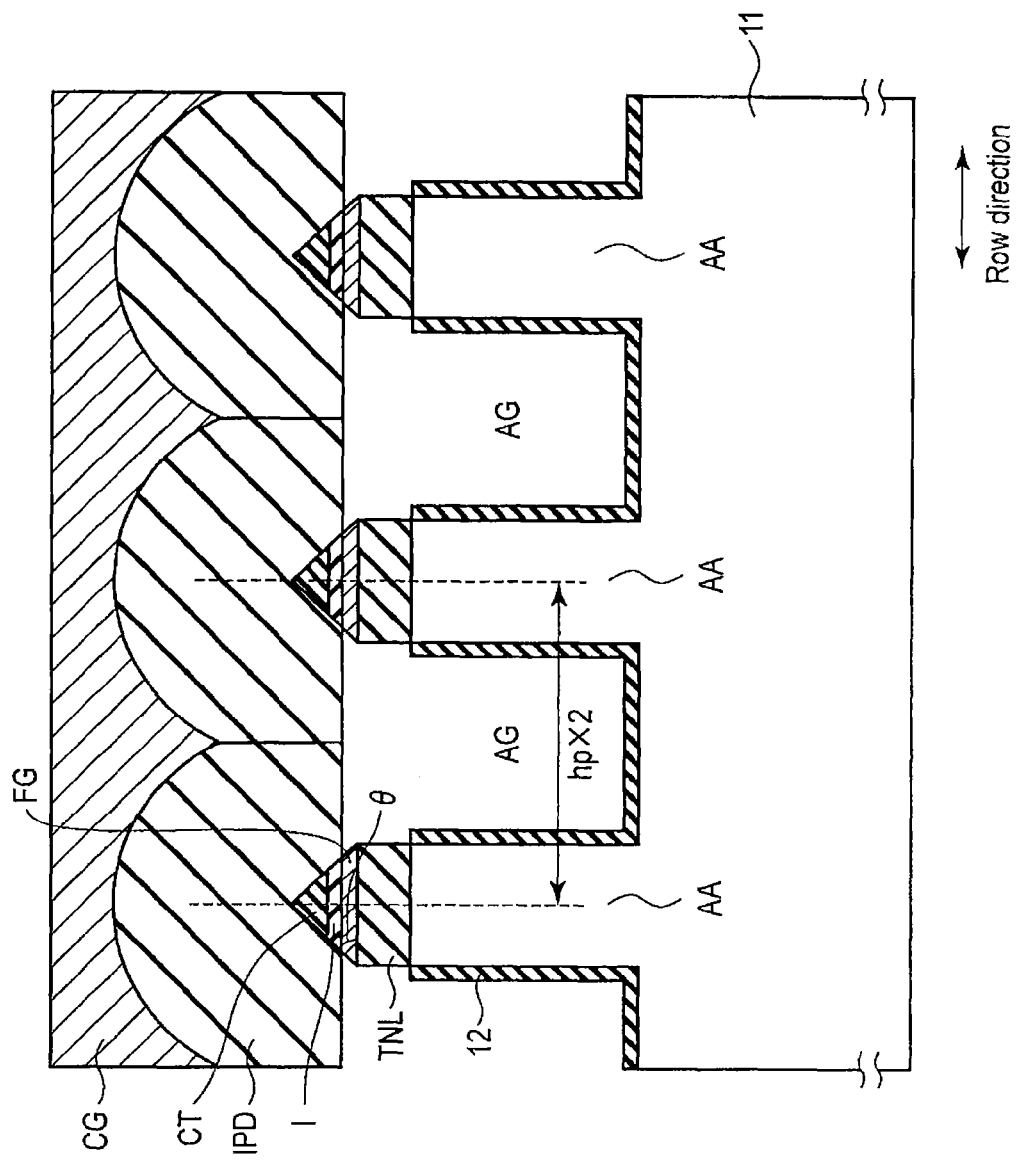
FIG. 46 is a sectional view showing a sixth modification.

FIG. 46 shows a cell array structure according to the sixth modification.

FIG. 46 corresponds to the sectional view (FIG. 27) in the row direction according to the second embodiment.

The cell array structure according to the present example is different from the cell array structure according to the second modification in that a charge storage layer of a memory cell includes a floating gate electrode FG as a conductive layer in an electrically floating state and a charge trap layer CT as an insulating layer arranged on the floating gate electrode FG to trap charges.

For example, the floating gate electrode FG whose sectional shape in the row direction is trapezoidal is arranged on a gate insulating layer (tunnel insulating layer) TNL. Further, the charge trap layer CT whose sectional shape in the row direction is triangular is arranged on the floating gate electrode FG.

The floating gate electrode FG includes, as described above, a polysilicon layer, a metallic layer, or a lamination layer of these layers. The charge trap layer CT includes an insulating layer of SiN, SiON, $Al_2O_3$, HfO or the like.

In the present example, an insulating layer (ultra-thin insulating layer) I of, for example, 10 nm or less in thickness is arranged between the floating gate electrode FG and the charge trap layer CT. The insulating layer I may be omitted.

The charge trap layer CT is completely covered with an inter-electrode insulating layer IPD, but a portion of the charge trap layer CT may be covered with the inter-electrode insulating layer IPD or a portion of the floating gate electrode FG may be covered with the inter-electrode insulating layer IPD.

The above structure is called the so-called hybrid type.

According to the hybrid type, the charge storage layer of a memory cell includes the floating gate electrode FG and the charge trap layer CT. The charge trap layer CT has a function to raise a potential barrier by trapping charges and thus has an effect of preventing a leak current between two charge storage layers adjacent in the row or column direction.

The present example can realize an increase in coupling ratio and prevention of inter-cell interference in the flat cell structure at the same time.

[Seventh Modification]

FIG. 47 shows a cell array structure according to the seventh modification.

FIG. 47 is an enlarged view of one memory cell in the sixth modification.

The cell array structure according to the present example is different from the sixth modification in that an entire charge trap layer CT and further a portion of a floating gate electrode FG are covered with an inter-electrode insulating layer IPD.

In other respects, the seventh modification is the same as the sixth modification.

With the structure as described above, the same effect as the above hybrid type can be achieved.

[Eighth Modification]

FIG. 48 shows a cell array structure according to the eighth modification.

FIG. 48 is also an enlarged view of one memory cell in the sixth modification.

The cell array structure according to the present example is different from the sixth modification in that a portion of a charge trap layer CT is covered an inter-electrode insulating layer IPD.

In other respects, the eighth modification is the same as the sixth modification.

With the structure as described above, the same effect as the above hybrid type can be achieved.

[Ninth Modification]

Figure 49:
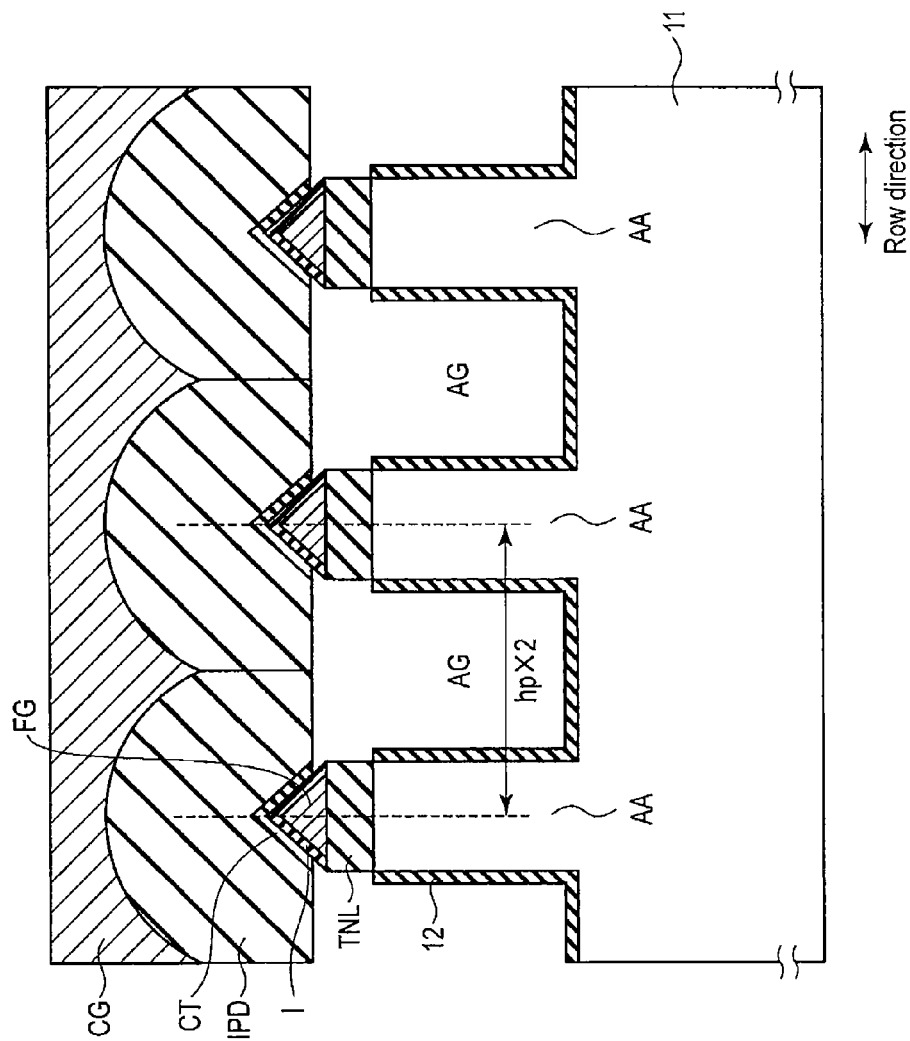
FIG. 49 is a sectional view showing a ninth modification.

FIG. 49 shows a cell array structure according to the ninth modification.

FIG. 49 corresponds to the sectional view (FIG. 27) in the row direction according to the second embodiment.

The cell array structure according to the present example relates, like the sixth modification, to the hybrid type. The present example is different from the cell array structure according to the second modification in that a charge trap layer CT is formed so as to cover a portion of the surface or the entire surface of a floating gate electrode FG.

For example, the floating gate electrode FG whose sectional shape in the row direction is triangular is arranged on a gate insulating layer (tunnel insulating layer) TNL. Further, an insulating layer (ultra-thin insulating layer) I of, for example, 10 nm or less in thickness is arranged so as to cover the entire surface of the floating gate electrode FG. The insulating layer may be omitted.

The charge trap layer CT is arranged on the surface of an upper portion of the floating gate electrode FG via the insulating layer I.

The floating gate electrode FG includes, as described above, a polysilicon layer, a metallic layer, or a lamination layer of these layers. The charge trap layer CT includes an insulating layer of SiN, SiON, $Al_2O_3$, HfO or the like.

The charge trap layer CT is completely covered with an inter-electrode insulating layer IPD, but a portion of the charge trap layer CT may be covered with the inter-electrode insulating layer IPD or a portion of the floating gate electrode FG may be covered with the inter-electrode insulating layer IPD.

According to the above structure, the charge storage layer of a memory cell includes the floating gate electrode FG and the charge trap layer CT. The charge trap layer CT has a function to raise a potential barrier by trapping charges and thus has an effect of preventing a leak current between two charge storage layers adjacent in the row or column direction.

The present example can realize an increase in coupling ratio and prevention of inter-cell interference in the flat cell structure at the same time.

[Tenth Modification]

FIG. 50 shows a cell array structure according to the tenth modification.

FIG. 50 is an enlarged view of one memory cell in the ninth modification.

The cell array structure according to the present example is different from the ninth modification in that an entire charge trap layer CT and further a portion of a floating gate electrode FG are covered with an inter-electrode insulating layer IPD.

For example, a portion in an area between the floating gate electrode FG and the inter-electrode insulating layer IPD where the charge trap layer CT is not present is an air gap.

In other respects, the tenth modification is the same as the ninth modification.

With the structure as described above, the same effect as the above hybrid type can be achieved.

[Eleventh Modification]

FIG. 51 shows a cell array structure according to the eleventh modification.

FIG. 51 is an enlarged view of one memory cell in the ninth modification.

The cell array structure according to the present example is different from the ninth modification in that an entire charge trap layer CT covers an entire floating gate electrode FG and further the surface of an active area AA.

Even if the charge trap layer CT covers the surface of the active area AA, a portion that actually traps charges is a portion adjacent to the floating gate electrode FG and thus, no problem is caused as memory cell characteristics.

In other respects, the eleventh modification is the same as the ninth modification.

With the structure as described above, the same effect as the above hybrid type can be achieved.

Summary

According to the second embodiment as described above, an increase in coupling ratio and prevention of inter-cell interference can be realized in the flat cell structure at the same time.

The air gap AG in each example according to the second embodiment described above may be replaced by an insulating layer (for example, a silicon oxide layer) whose relative dielectric constant is smaller than that of the inter-electrode insulating layer IPD.

In each example of the second embodiment shown in FIGS. 26 to 45, the floating gate electrode FG may be replaced by the charge trap layer as an insulating layer that traps charges. That is, in these examples of the second embodiment, the charge storage layer of a memory cell, may be a floating gate electrode or a charge trap layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   first and second fin-type active areas arranged on the semiconductor substrate, aligned in a first direction, and extending in a second direction crossing to the first direction;

a first memory cell on the first fin-type active area; and
a second memory cell on the second fin-type active area,
wherein the first memory cell includes a first gate insulating layer on the first fin-type active area, a first charge storage layer arranged on the first gate insulating layer and in which a width thereof in the first direction becomes narrower upward from below, a first inter-electrode insulating layer formed along a first surface of an upper portion of the first charge storage layer from a first lowest edge on one side of the first surface to extend over a top of the first charge storage layer to a second lowest edge on another side of the first surface in the first direction, and a control gate electrode arranged above the first charge storage layer via the first inter-electrode insulating layer and extending in the first direction,
the second memory cell includes a second gate insulating layer on the second fin-type active area, a second charge storage layer arranged on the second gate insulating layer and in which the width thereof in the first direction becomes narrower upward from below, a second inter-electrode insulating layer formed along a second surface of an upper portion of the second charge storage layer from a third lowest edge on one side of the second surface to extend over a top of the second charge storage layer to a fourth lowest edge on another side of the second surface in the first direction, and the control gate electrode arranged above the second charge storage layer via the second inter-electrode insulating layer,
the first and second inter-electrode insulating layers have a first contact portion through which both are in contact with each other in the first direction, and
thicknesses of the first and second inter-electrode insulating layers in the first contact portion in a third direction perpendicular to the first and second directions are smaller than thicknesses of the first and second inter-electrode insulating layers in the third direction in top portions of the first and second charge storage layers respectively,
wherein the first inter-electrode insulating layer and the second inter-electrode insulating layer are separate layers which contact each other at a point that is above the first, second, third, and fourth lowest edges, and that is below a top of the charge storage layer.

2. The memory of claim 1, wherein each of the thicknesses of the first and second inter-electrode insulating layers in the first direction in a side face portion present in the first direction of the first and second charge storage layers is larger than half a space in the first direction between the first and second fin-type active areas.

3. The memory of claim 1, wherein, between the first and second fin-type active areas, the control gate electrode has a bottom portion in the first contact portion and the bottom portion of the control gate electrode is below the top portions of the first and second charge storage layer.

4. The memory of claim 1,
wherein a space between lower portions of the first and second charge storage layers is an air gap.

5. The memory of claim 1,
wherein if the first and second memory cells are cut at a plane made in the first direction and the third direction, the first and second charge storage layers have one selected from a triangle and a trapezoid.

6. The memory of claim 1,
wherein each of the first and second charge storage layers includes a floating gate electrode and a charge trap layer arranged on the floating gate electrode.

7. The memory of claim 6,
wherein each of the first and second charge storage layers further includes an insulating layer arranged between the floating gate electrode and the charge trap layer.

8. The memory of claim 1, wherein
between the first and second fin-type active areas, a bottom surface in the third direction of the first contact portion between the first and second inter-gate insulating layers is higher than the first, the second, the third, and the fourth lowest edges.

9. A nonvolatile semiconductor memory device comprising:
a semiconductor substrate;
first and second fin-type active areas arranged on the semiconductor substrate, aligned in a first direction, and extending in a second direction crossing to the first direction;
a first memory cell on the first fin-type active area; and
a second memory cell on the second fin-type active area,
wherein the first memory cell includes a first gate insulating layer on the first fin-type active area, a first charge storage layer arranged on the first gate insulating layer and in which a width thereof in the first direction becomes narrower upward from below, a first inter-electrode insulating layer formed along a first surface of an upper portion of the first charge storage layer from a first lowest edge on one side of the first surface to extend over a top of the first charge storage layer to a second lowest edge on another side of the first surface in the first direction, and a control gate electrode arranged on the first inter-electrode insulating layer and extending in the first direction,
the second memory cell includes a second gate insulating layer on the second fin-type active area, a second charge storage layer arranged on the second gate insulating layer and in which the width thereof in the first direction becomes narrower upward from below, a second inter-electrode insulating layer formed along a second surface of an upper portion of the second charge storage layer from a third lowest edge on one side of the second surface to extend over a top of the second charge storage layer to a fourth lowest edge on another side of the second surface in the first direction, and the control gate electrode arranged on the second inter-electrode insulating layer, and
the first and second inter-electrode insulating layers are isolated from each other via an opening in the first direction,
wherein the first inter-electrode insulating layer and the second inter-electrode insulating layer are separate layers which contact each other at a point that is above the first, second, third, and fourth lowest edges, and that is below a top of the charge storage layer.

10. The memory of claim 9, wherein each of the thicknesses of the first and second inter-electrode insulating layers in the first direction in a side face portion present in the first direction of the first and second charge storage layers is larger than half a space in the first direction between the first and second fin-type active areas.

11. The memory of claim 9, wherein, between the first and second fin-type active areas, the control gate electrode has a bottom portion in the opening and the bottom portion of the control gate electrode is below the top portions of the first and second charge storage layer.

12. The memory of claim 9,
wherein a space between lower portions of the first and second charge storage layers is an air gap.

13. The memory of claim 9,
wherein if the first and second memory cells are cut at a plane made in the first direction and the third direction, the first and second charge storage layers have one selected from a triangle and a trapezoid.

14. The memory of claim 9,
wherein each of the first and second charge storage layers includes a floating gate electrode and a charge trap layer arranged on the floating gate electrode.

15. The memory of claim 14,
wherein each of the first and second charge storage layers further includes an insulating layer arranged between the floating gate electrode and the charge trap layer.

16. The memory of claim 9, wherein
between the first and second fin-type active areas, the opening between the first and second inter-gate insulating layers is higher than the first, the second, the third, and the fourth lowest edges.

17. A nonvolatile semiconductor memory device comprising:
a semiconductor substrate;
first and second fin-type active areas arranged on the semiconductor substrate, aligned in a first direction, and extending in a second direction crossing to the first direction;
a first memory cell on the first fin-type active area; and
a second memory cell on the second fin-type active area,
wherein the first memory cell includes a first gate insulating layer on the first fin-type active area, a first charge storage layer arranged on the first gate insulating layer and in which a width thereof in the first direction becomes narrower upward from below, a first inter-electrode insulating layer formed along a first surface of an upper portion of the first charge storage layer from a first lowest edge on one side of the first surface to extend over a top of the first charge storage layer to a second lowest edge on another side of the first surface in the first direction and extending in the first direction, and a control gate electrode arranged on the first inter-electrode insulating layer and extending in the first direction,
the second memory cell includes a second gate insulating layer on the second fin-type active area, a second charge storage layer arranged on the second gate insulating layer and in which the width thereof in the first direction becomes narrower upward from below, a second inter-electrode insulating layer formed along a second surface of an upper portion of the second charge storage layer from a third lowest edge on one side of the second surface to extend over a top of the second charge storage layer to a fourth lowest edge on another side of the second surface in the first direction, and the control gate electrode arranged above the second charge storage layer via the inter-electrode insulating layer, and
thickness of the inter-electrode insulating layers in a third direction perpendicular to the first and second directions in an intermediate portion between the first and second fin-type active areas is smaller than thicknesses of the inter-electrode insulating layer in the third direction in top portions of the first and second charge storage layers,
wherein the first inter-electrode insulating layer and the second inter-electrode insulating layer are separate layers which contact each other at a point that is above the first, second, third, and fourth lowest edges, and that is below a top of the charge storage layer.

18. The memory of claim 17, wherein the inter-electrode insulating layer includes a part having a thicknesses in the first direction between the first and second charge storage layers larger than a space in the first direction between the first and second fin-type active areas.

19. The memory of claim 17, wherein, between the first and second fin-type active areas, the control gate electrode has a bottom portion in the intermediate portion between the first and second fin-type active areas and the bottom portion of the control gate electrode is below the top portions of the first and second charge storage layer.

20. The memory of claim 17, wherein a space between lower portions of the first and second charge storage layers is an air gap.

21. The memory of claim 17, wherein each of the first and second charge storage layers includes a floating gate electrode and a charge trap layer arranged on the floating gate electrode.

22. The memory of claim 21, wherein each of the first and second charge storage layers further includes an insulating layer arranged between the floating gate electrode and the charge trap layer.

23. The memory of claim 17, wherein
between the first and second fin-type active areas, a bottom surface in the third direction of the intermediate portion is higher than the first, the second, the third, and the fourth lowest edges.

* * * * *